(12) United States Patent
Ressier et al.

(10) Patent No.: US 9,975,764 B2
(45) Date of Patent: May 22, 2018

(54) MICRO/NANO STRUCTURES OF COLLOIDAL NANOPARTICLES ATTACHED TO AN ELECTRET SUBSTRATE AND METHOD FOR PRODUCING SUCH MICRO/NANO STRUCTURES

(71) Applicants: Institut National Des Sciences Appliquees De Toulouse, Toulouse (FR); Centre National De La Recherche Scientifique, Paris (FR); Universite Paul Sabatier Toulouse III, Toulouse (FR)

(72) Inventors: Laurence Ressier, Ramonville Saint Agne (FR); Sangeetha Neralagatta Munikrishnaiah, Toulouse (FR); Pierre Moutet, Toulouse (FR)

(73) Assignees: Institut National des Sciences Appliquees de Toulouse, Toulouse (FR); Centre National de la Recherche Scientifique, Paris (FR); Universite Paul Sabatier Toulouse III, Toulouse (FR)

( * ) Notice: Subject to any disclaimer, the term of this patent is extended or adjusted under 35 U.S.C. 154(b) by 111 days.

(21) Appl. No.: 14/772,980

(22) PCT Filed: Feb. 27, 2014

(86) PCT No.: PCT/IB2014/059308
§ 371 (c)(1),
(2) Date: Sep. 4, 2015

(87) PCT Pub. No.: WO2014/136023
PCT Pub. Date: Sep. 12, 2014

(65) Prior Publication Data
US 2016/0009552 A1    Jan. 14, 2016

(30) Foreign Application Priority Data

Mar. 8, 2013   (FR) .................................... 13 52092

(51) Int. Cl.
*B81C 1/00*     (2006.01)
*B05D 3/14*     (2006.01)
(Continued)

(52) U.S. Cl.
CPC ............ *B81C 1/00373* (2013.01); *B05D 3/14* (2013.01); *G03G 5/024* (2013.01); *H01G 7/02* (2013.01); *B82Y 30/00* (2013.01); *B82Y 40/00* (2013.01)

(58) Field of Classification Search
CPC ...... B05D 3/14; B81C 1/00373; G03G 5/024; H01G 7/02
See application file for complete search history.

(56) References Cited

U.S. PATENT DOCUMENTS

| | | | | |
|---|---|---|---|---|
| 7,232,771 B2 * | 6/2007 | Jacobs | ..................... | G03G 5/02 257/E21.028 |
| 8,025,952 B2 * | 9/2011 | Raksha | ................ | B42D 25/369 283/109 |
| 8,093,144 B2 * | 1/2012 | Jacobson | ............... | B82Y 10/00 257/E21.16 |

OTHER PUBLICATIONS

International Search Report issued in corresponding International Patent Application No. PCT/IB2014/059308 dated Apr. 9, 2014.
(Continued)

*Primary Examiner* — Jeffrey Zweizig
(74) *Attorney, Agent, or Firm* — Morgan, Lewis & Bockius LLP

(57) ABSTRACT

Method for producing a directed monolayer or multilayer assembly of colloidal nanoparticles attached to an electret substrate, including imparting a surface electric potential to an electret substrate according to a pattern of positive and/or
(Continued)

negative electric charges, and contacting an electret substrate with a colloidal dispersion. The colloidal dispersion has electrically neutral or near neutral and electrically polarizable colloidal nanoparticles, and a nonpolarizing or weakly polarizing dispersion medium. The absolute value of the surface electric potential and the concentration of polarizable nanoparticles are no lower than a first surface electric potential threshold and no lower than a second concentration threshold, respectively, such as to obtain an assembly having a desired geometric shape, at least the first layer of which is compact in terms of the absence of undesired gaps having sizes greater than the size of two adjacent nanoparticles, preferably not greater than the size of one nanoparticle.

19 Claims, 8 Drawing Sheets

(51) Int. Cl.
  *G03G 5/024* (2006.01)
  *H01G 7/02* (2006.01)
  *B82Y 30/00* (2011.01)
  *B82Y 40/00* (2011.01)

(56) References Cited

OTHER PUBLICATIONS

Palleau et al., "Quantification of the electrostatic forces involved in the directed assembly of colloidal nanoparticles by AFM nanoxerography," Nanotechnology, 22: 325603 (2011).
Barry et al., "Printing nanoparticles from the liquid and gas phases using nanoxerography," Nanotechnology, 14: 1057-1063 (2003).
Palleau et al., "Coulomb Force Directed Single and Binary Assembly of Nanoparticles from Aqueous Dispersions by AFM Nanoxerography," ACS NANO, 5: 4228-4235 (2011).
Ressier et al., "How to Control AFM Nanoxerography for the Templated Monolayered Assembly of 2nm Colloidal Gold Nanoparticles," IEEE Transactions on Nanotechnology, 8: 487-491 (2009).
Blumenthal et al., "Patterned direct-write and screen-printing of NIR-to-visible upconverting inks for security applications," Nanotechnology, 23: 185305 (2012).
International Preliminary Report on Patentability and Written Opinion issued in corresponding International Patent Application No. PCT/IB2014/059308 dated Sep. 8, 2015.

\* cited by examiner

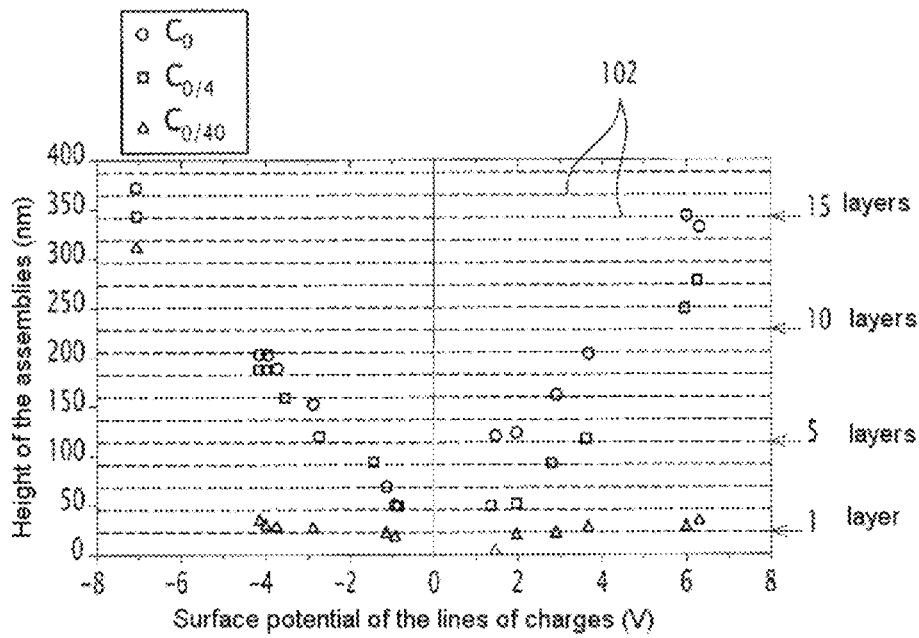
FIG.5
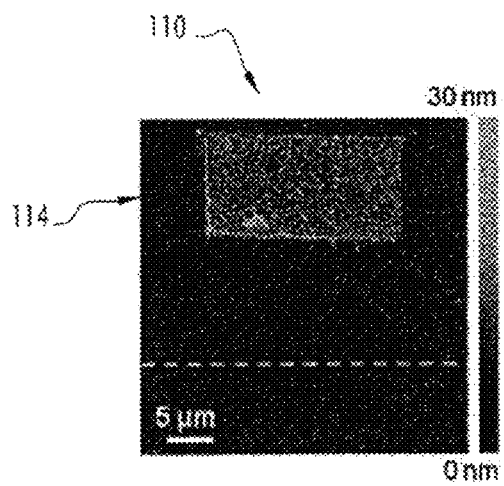
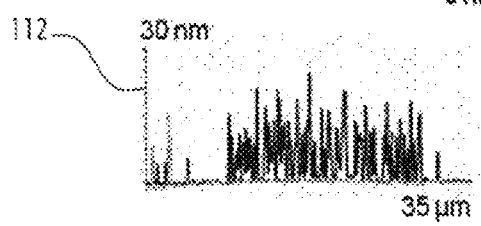
FIG.6

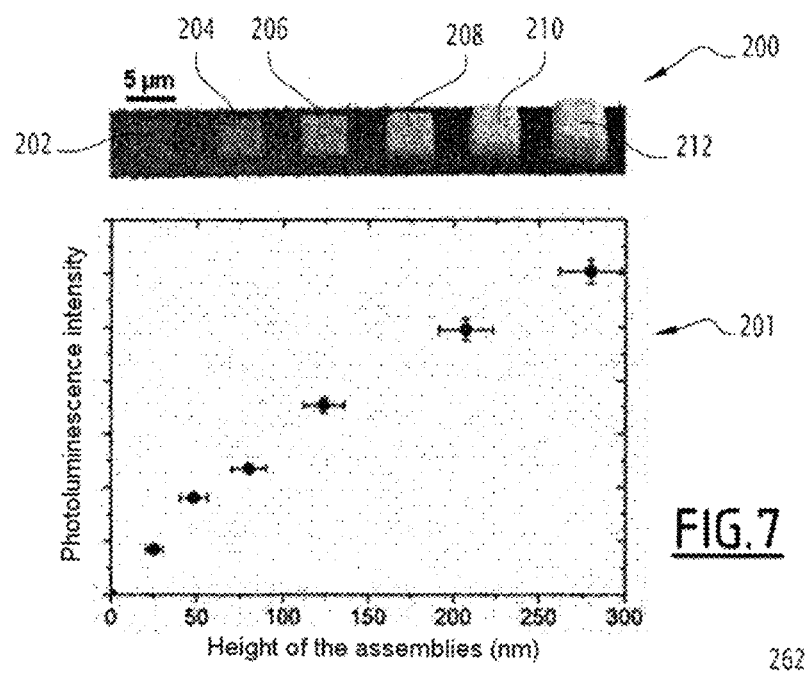
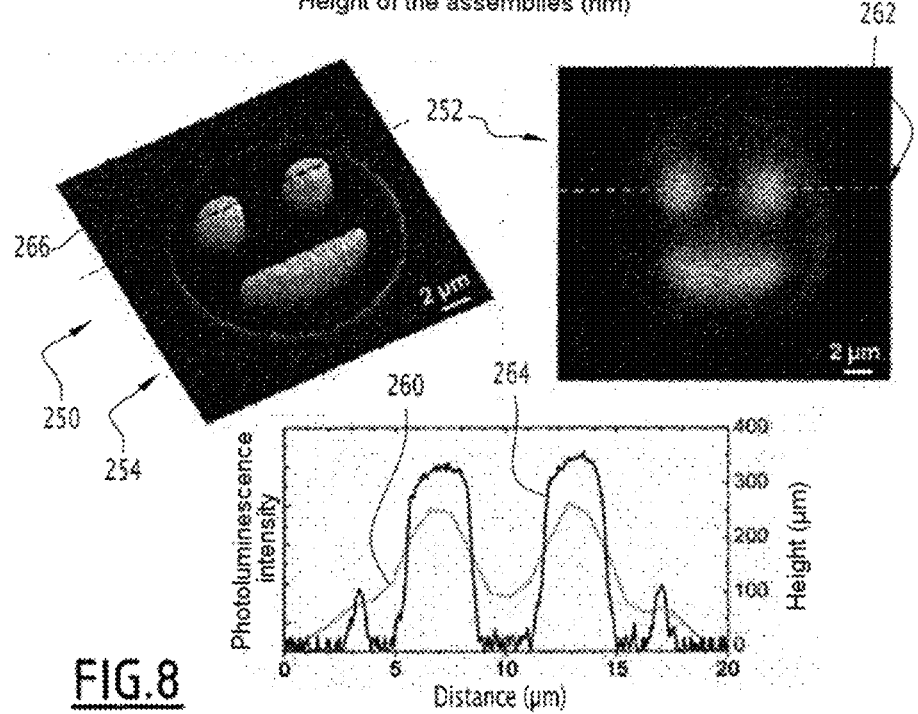

MICRO/NANO STRUCTURES OF COLLOIDAL NANOPARTICLES ATTACHED TO AN ELECTRET SUBSTRATE AND METHOD FOR PRODUCING SUCH MICRO/NANO STRUCTURES

The present invention relates to micro/nanostructures existing in the form of a monolayer or multilayer assembly of colloidal nanoparticles which are attached to an electret substrate, which are arranged in compact fashion, and to processes for the manufacture of these micro/nanostructures.

Throughout the text, "electret material" denotes any material capable of retaining, for at least a certain period of time, an electrical polarization induced by an electric field, after said electric field has been canceled.

Throughout the text, colloidal nanoparticles are solid bodies, having at least one of the dimensions between 1 and 1000 nm, forming a discrete phase dispersed in a continuous or dispersing medium having a different composition, without being dissolved by it. Colloidal nanoparticles can in particular be colloidal nanocrystals.

Throughout the text, "charged" colloidal nanoparticle denotes any electrically charged colloidal nanoparticle capable of being trapped under the action of Coulomb or electrophoretic forces by an electric field generated by patterns of charges written at the surface of an electret substrate.

Throughout the text, "polarizable neutral" colloidal nanoparticle denotes any electrically neutral or quasineutral colloidal nanoparticle capable of being electrically polarized when it is subjected to the action of an external electric field and capable of being trapped under the action solely of the dielectrophoretic forces by an electric field generated by patterns of charges written at the surface of an electret substrate.

$NaYF_4$ colloidal nanocrystals having a hexagonal unit cell and doped with lanthanides have already shown their great advantage due to their ability to efficiently convert near infrared radiation of low energy into visible radiation with a higher energy luminescence, this type of conversion being known under the name up-conversion or conversion which is elevating in terms of frequencies. In addition to the attraction provided by unique optical properties, such as narrow emission bands, long lifetimes of excited states and a stable photonic response, the up-conversion of the $NaYF_4$ colloidal nanocrystals doped with $Ln^{3+}$ lanthanides exhibits promising applications in the fields of solid lasers, low intensity infrared imaging, sensors, security labeling, displays and photovoltaic devices.

In order to exploit the optical properties of $NaYF_4$ colloidal nanocrystals doped with lanthanides, several processes have been developed for assembling colloidal nanocrystals into micropatterns on surfaces. These processes, devoid of the writing of patterns of charges at the surface, are, for example, mechanical microcontact (µCP) combined with "figures blown" by drops of water, the photoformation of patterns using a chemical amplification reaction, micromolding in capillaries (MIMIC) using polystyrene spheres, or colloidal lithography.

However, these processes exhibit the disadvantages according to which (i) the height of the colloidal nanocrystal assemblies is not controlled and commanded with accuracy, (ii) the spatial resolution of the patterns of colloidal nanocrystals created is limited, (iii) the geometries of the patterns are limited and comprise defects, (iv) the duration of implementation of the processes is high and (v) micropatterns spatially controlled with two types of nanocrystals (binary assemblies) cannot be produced.

For some years, atomic force microscopy (AFM) nanoxerography has proved to be an innovative technique for the manufacture of directed assemblies of colloids on surfaces.

This technique uses patterns of electric charges written on electrets by an AFM tip to electrostatically trap colloidal nanoparticles from their dispersions.

However, the assemblies produced by this technique are to date limited to monolayer assemblies and these assemblies generally lack compactness by exhibiting undesired gaps with sizes greater than the size of two adjacent nanoparticles, thus seriously limiting their potential application.

The paper by Shien-Der Tzeng et al. entitled "Templated self-assembly of colloidal nanoparticles controlled by electrostatic nanopatterning on a $Si_3N_4/SiO_2/Si$ electret", published in the review Advanced Materials, 2006, No. 18, pp. 1147-1151, describes a monolayer assembly of positively charged gold nanoparticles having a high compactness. This assembly is obtained by the action of electrophoretic forces exerted between patterns of negative charges written at the surface of the electret substrate and positively charged gold nanoparticles.

A first technical problem is to have available a process for the manufacture of directed mono- or multilayer assemblies of colloidal nanoparticles, packed as close as possible to improve the control of the compactness of at least the first layer in terms of absence of undesired gaps with sizes of greater than or equal to the size of two adjacent nanoparticles, preferably greater than or equal to the size of one particle.

A second technical problem, closely related to the first problem, is to have available a process for the manufacture of directed mono- or multilayer binary assemblies of colloidal nanoparticles of two different types, packed as close as possible in order to ensure a controlled compactness of at least the first layer in terms of absence of undesired gaps with sizes of greater than or equal to the size of two adjacent nanoparticles, preferably greater than or equal to the size of one particle.

To this end, a subject matter of the invention is a process for the manufacture of a micro/nanostructure formed of colloidal nanoparticles comprising a monolayer or multilayer assembly of colloidal nanoparticles which are attached to an electret substrate, having a freely chosen and predetermined geometric shape, at least the first layer of which is compact in terms of absence of undesired gaps with sizes of greater than or equal to the size of two adjacent nanoparticles, preferably greater than or equal to the size of one nanoparticle, comprising the stages consisting in:

in a first stage, providing an electret substrate, composed of an electret material and having a free receiving surface, then in a second stage, writing a surface electric potential on the receiving surface of the electret substrate according to a predetermined pattern of positive and/or negative electric charges corresponding to the monolayer or multilayer assembly of nanoparticles, then in a third stage, bringing the electret substrate having the receiving surface written with the surface potential according to the desired pattern of electric charges into contact with a colloidal dispersion for a contacting time which is sufficiently long and less than or equal to fifteen minutes, characterized in that:

the colloidal dispersion comprises electrically neutral or quasineutral colloidal particles which are electrically polarizable under the action of an external electric field and a dispersing medium, in the form of a liquid solvent or a gas which is substantially devoid of an electrical polarization action, in which the colloidal nanoparticles are dispersed, and the absolute value of the surface electric potential and the concentration of polarizable nanoparticles are respectively greater than or equal to a first surface electric potential threshold and to a second concentration threshold, the first and second thresholds each depending on the nature of the dispersing medium and on the nature of the polarizable nanoparticles, so that after the first contacting time, the micro/nanostructure obtained is a monolayer or multilayer micro/nanostructure having the desired geometric shape, at least the first layer of which is compact in terms of absence of undesired gaps with sizes greater than or equal to the size of two adjacent nanoparticles, preferably greater than or equal to the size of one nanoparticle, the nanoparticles being bonded to one another and/or to the substrate under the action of dielectrophoretic forces created from the interaction between the polarizable nanoparticles and the written surface potential.

According to specific embodiments, the process for the manufacture of a micro/nanostructure formed of colloidal nanoparticles comprises one or more of the following characteristics:

the assembly of colloidal nanoparticles which are attached to the electret substrate, having a freely chosen and predetermined geometric shape, is a multilayer assembly, at least the first layer of which is compact, and the absolute value of the surface electric potential and the concentration of polarizable nanoparticles are respectively greater than or equal to a third surface electric potential threshold and greater than or equal to a fourth concentration threshold, the third and fourth thresholds each depending on the nature of the dispersing medium and on the nature of the polarizable nanoparticles, so that after the contacting time, the micro/nanostructure obtained is the multilayer micro/nanostructure having the desired geometric shape, at least the first layer of which is compact in terms of absence of undesired gaps with sizes of greater than or equal to the size of two adjacent nanoparticles, preferably with sizes greater than or equal to the size of one nanoparticle, the nanoparticles being bonded to one another and/or to the substrate under the action of dielectrophoretic forces created from the interaction between the neutral and electrically polarizable nanoparticles and the written surface potential;

the assembly of colloidal nanoparticles which are attached to an electret substrate, having a freely chosen and predetermined geometric shape, is a multilayer assembly of a certain number NI of layers, each of the layers of which is compact in terms of absence of undesired gaps with sizes greater than the size of two adjacent nanoparticles, preferably greater than the size of one nanoparticle, and the absolute value of the surface electric potential and the concentration of polarizable nanoparticles are respectively greater than or equal to a fifth surface electric potential threshold and to a sixth concentration threshold, the fifth and sixth thresholds each depending on the nature of the dispersing medium, on the nature of the polarizable nanoparticles and on the number of layers, so that after the contacting time, the micro/nanostructure obtained is the multilayer micro/nanostructure having the desired geometric shape, all the layers of which are compact in terms of absence of undesired gaps with a size greater than or equal to the size of two adjacent nanoparticles, preferably greater than or equal to the size of one nanoparticle, the nanoparticles being bonded to one another and/or to the substrate under the action of dielectrophoretic forces created from the interaction between the polarizable nanoparticles and the written surface potential.

According to a first embodiment, another subject matter of the invention is a process for the manufacture of a binary micro/nanostructure formed of two types of colloidal nanoparticles comprising:

a first monolayer assembly of colloidal nanoparticles of the first type, which are attached to an electret substrate and having a first freely chosen and predetermined geometric shape, and a second monolayer or multilayer assembly of colloidal nanoparticles of the second type, which are attached to an electret substrate and having a second freely chosen and predetermined geometric shape, at least the first layer of which is compact in terms of absence of undesired gaps with a size greater than or equal to the size of two adjacent nanoparticles of the second type, preferably greater than or equal to the size of one nanoparticle, characterized in that the process comprises the stages consisting in:

in a first stage, providing an electret substrate composed of an electret material and having a free receiving surface, then in a second stage, writing, sequentially or in parallel, a surface electric potential on the receiving surface of the electret substrate according to a predetermined pattern of electric charges having a first sign and of electric charges having a second sign opposite the first, the pattern of charges being composed of a first subpattern of charges of the first sign, corresponding to the first monolayer assembly of nanoparticles of the first type, and of a second subpattern of charges of the second sign, corresponding to the second monolayer or multilayer assembly of nanoparticles of the second type, in a third stage, bringing the electret substrate having the receiving surface written with the surface potential into contact with a first colloidal dispersion for a first contacting time, the first colloidal dispersion comprising nanoparticles of the first type electrically charged according to the second sign and a first dispersing medium in the form of a liquid solvent or of a gas and the first contacting time being sufficiently long to allow the formation, on the first subpattern of charges written in the electret substrate, of the first monolayer assembly, having the desired first geometric shape, of nanoparticles of the first type bonded to the substrate under the action of electrophoretic forces created from the Coulomb interaction between the nanoparticles of the first type and the surface potential of the first subpattern of charges, then in a fourth stage, drying the electret substrate and the first assembly, together forming an intermediate micro/nanostructure of end of third stage, by removing the first dispersing medium, then in a fifth stage, bringing the dried intermediate structure into contact with a second colloidal dispersion for a second contacting time, the second colloidal dispersion comprising colloidal nanoparticles of the second type which are electrically neutral or quasineutral and electrically polarizable under the action of an external electric field and a second dispersing medium in the form of a liquid solvent or of a gas, substantially devoid of an electrical polarization action, in which the colloidal nanoparticles of the second type are dispersed, and the absolute value of the surface electric potential and the concentration of nanoparticles of the second type being respectively greater than or equal to a first surface electric potential threshold and greater than or equal to a second concentration threshold, the first and second thresholds each depending on the nature of the second dispersing medium and on the nature of the polarizable nanoparticles of the second type, so that after the second contacting time, which is sufficiently long and less than 15 minutes, the second assembly obtained is the second monolayer or multilayer assembly having the second desired geometric shape, and at least the first layer of which is compact in terms of absence of undesired gaps with a size greater than or equal to the size of two adjacent nanoparticles, preferably greater than or equal to the size of one nanoparticle, the nanoparticles being bonded to one another and/or to the substrate under the action of dielectrophoretic forces created from the interaction between the polarizable nanoparticles and the surface potential of the second subpattern.

According to a second embodiment, another subject matter of the invention is a process for the manufacture of a binary micro/nanostructure formed of two types of colloidal nanoparticles comprising:

a first monolayer or multilayer assembly of colloidal nanoparticles of the first type, which are attached to an electret substrate, having a first freely chosen and predetermined geometric shape, and a second monolayer or multilayer assembly of colloidal nanoparticles of the second type, which are attached to an electret substrate, having a second freely chosen and predetermined geometric shape, at least the first layer of which is compact in terms of absence of undesired gaps with a size greater than the size of two adjacent nanoparticles of the second type, preferably greater than the size of one nanoparticle of the second type, characterized in that the process comprises the stages consisting in:

in a first stage, providing an electret substrate composed of an electret material and having a free receiving surface, then in a second stage, writing, sequentially or in parallel, a first surface electric potential on the receiving surface of the electret substrate according to a first predetermined subpattern of electric charges having a first sign, corresponding to the first assembly of nanoparticles of the first type, the first subpattern making up a first part of a pattern of charges which also comprises a second predetermined subpattern of electric charges having a second sign opposite the first sign, in a third stage, bringing the electret substrate having the receiving surface written with the first surface potential into contact with a first colloidal dispersion for a first contacting time of less than or equal to 15 minutes, the first colloidal dispersion comprising nanoparticles of the first type, either electrically charged according to the second sign or substantially neutral and electrically polarizable, and a first dispersing medium in the form of a liquid solvent or of a gas and the first contacting time being sufficiently long to allow the formation, on the first subpattern of charges written in the electret substrate, of the first assembly, having the first monolayer or multilayer geometric shape, of nanoparticles of the first type bonded to the substrate, either under the action of electrophoretic forces created from the Coulomb interaction between the nanoparticles of the first type and the surface potential of the first subpattern of charges, when the nanoparticles of the first type are electrically charged according to the second sign, or under the action of dielectrophoretic forces created from the interaction between the polarizable nanoparticles and the surface potential of the first subpattern of charges when the nanoparticles of the first type are substantially neutral and electrically polarizable, in a fourth stage, drying the electret substrate and the first assembly, together forming an intermediate micro/nanostructure of end of third stage, then, in a fifth stage, writing, sequentially or in parallel, a second surface electric potential on the receiving surface of the electret substrate of the dried intermediate structure outside the regions covered by the first assembly, according to the second predetermined subpattern of electric charges having the second sign, then in a sixth stage, bringing the intermediate structure written with the second surface potential into contact with a second colloidal dispersion for a second contacting time, the second colloidal dispersion comprising colloidal nanoparticles of the second type, which are electrically neutral or quasineutral and electrically polarizable under the action of an external electric field, and a second dispersing medium in the form of a liquid solvent or of a gas, which is substantially devoid of an electrical polarization action, in which the colloidal nanoparticles are dispersed, and the value of the electric surface potential and the concentration of nanoparticles of the second type being respectively greater than or equal to a first surface electric potential threshold and greater than or equal to a second concentration threshold, the first and second thresholds each depending on the nature of the second dispersing medium and on the nature of the polarizable nanoparticles of the second type, so that, after the second contacting time, the second assembly obtained is the second monolayer or multilayer assembly having the second desired geometric shape, at least the first layer of which is compact in terms of absence of undesired gaps with a size greater than or equal to the size of two adjacent nanoparticles of the second type, preferably greater than or equal to the size of one nanoparticle of the second type, the nanoparticles being bonded to one another and/or to the substrate under the action of dielectrophoretic forces created from the interaction between the polarizable nanoparticles and the surface potential of the second subpattern.

According to specific embodiments, the processes for the manufacture of a binary micro/nanostructure formed of two types of colloidal nanoparticles described above comprise one or more of the following characteristics:

the colloidal nanoparticles of the first type have the property of converting radiation in the near infrared (NIR) spectrum into radiation in a first visible spectrum, and the nanoparticles of the second type have the property of converting the same radiation in the near infrared (NIR) spectrum into radiation in a second visible spectrum, the first visible spectrum being different from the second visible spectrum;

the concentration of charged nanoparticles of the first type, the first dispersing medium, the nanoparticles of the first type in terms of size, the first subpattern of charges, the first contacting time, the concentration of polarizable nanoparticles of the second type, the second dispersing medium, the nanoparticles of the second type in terms of size and polarizability and the second contacting time are chosen in order to obtain the first assembly having the first geometric shape and the second assembly having the desired second geometric shape, the first and second geometric shapes being conjugate shapes having the same height with respect to the receiving surface of the substrate, so that the geometric shape of the first assembly and the geometric shape of the second separate assembly are undetectable topographically by AFM or by optical microscopy using illumination in the visible spectrum.

According to specific embodiments, the processes for the manufacture of a micro/nanostructure of colloidal nanoparticles described above comprise one or more of the following characteristics:

the stage of writing the surface electric potential on the receiving surface of the electret substrate according to a pattern of charges is carried out according to preference, by a process of sequential writing of positive and/or negative charges on the electret substrate included within the group formed by inscription of electric charges by a beam of focused ions, inscription of electric charges by a beam of focused electrons, inscription of electric charges by atomic force microscopy (AFM) and inscription of electric charges by electrophotography, by a process of writing in parallel of positive and/or negative charges on the electret substrate included within the group formed by electrical nanoimprinting and electrical microcontact;

the electret material is a material included within the group formed by polymethyl methacrylates (PMMA), cyclic olefin copolymers (COC), polyethylene terephthalates (PET), polydimethylsiloxanes (PDMS), polypropylenes (PP), polycarbonates (PC), polystyrenes (PS), polyvinyl chlorides (PVC), polytetrafluoroethylenes (PFTE), triglycine sulfate (TGS), polyvinylidene fluoride (PVDF), silicon nitride ($Si_3N_4$), silicon oxide ($SiO_2$), or the compound $Si_3N_4/SiO_2/Si$ (NOS);

the substantially neutral and electrically polarizable colloidal nanoparticles are compounds stabilized by themselves or by ligands and/or charges, having physical properties included within the group formed by plasmonic, conducting, magnetic, luminescent, catalytic, electrochromic or photochromic properties, rendered substantially neutral and electrically polarizable, produced from base colloidal nanoparticles, the base colloidal nanoparticles having a solid core and, if appropriate, a shell and being included within the group formed by the latex, $SiO_2$, $TiO_2$, $ZrO_2$; CdS, CdSe, PbSe, GaAs, GaN, InP, $In_2O_3$, ZnS, ZnO, $MoS_2$, Si, C, ITO, $Fe_2O_3$, $Fe_3O_4$, Co, Fe—Co, $Fe_3C$, $Fe_5C_2$, Ni; Au, Ag, Cu, Pt, and the bimetallic nanoparticles; $WO_3$; $NaLnF_4$, the lanthanide fluorides ($LnF_3$), the lanthanide oxides ($Ln_2O_3$), the zirconates, silicates, hydroxides ($Ln(OH)_3$) and the sulfides of oxides doped or not doped with one or more different lanthanides (Ln denoting a lanthanide), the mixtures of these compounds, and the dispersing medium for the polarizable nanoparticles is, according to preference, a liquid solvent or a nonpolarizing gas, the liquid solvent being included within the group formed by pentane, isopentane, hexane, heptane, octane, nonane, decane, cyclopentane, cyclohexane, cycloheptane, cyclooctane, cyclohexene, benzene, toluene, methylcyclohexane, xylene, mesitylene, chloroform, methylene chloride or tetrachloroethylene, the nonpolarizing dispersing gas being included within the group formed by molecular nitrogen $N_2$, argon Ar and air; and the process for the manufacture of a micro/nanostructure of colloidal nanoparticles defined above comprises the additional stages consisting in:

choosing and locating by spatial coordinates on the electret substrate where the assembly has been formed a surface region not covered by the assembly to which nanoparticles have been attached in a chance and uncontrolled manner, in the form of a structure resulting from deposition noise, having a distribution which is not very dense in terms of compactness, random and dependent on the sample of the electret substrate on which the assembly has been formed, then capturing an image of the random structure of the nanoparticles deposited in the chosen surface region and forming a signature, the captured image being according to preference an AFM topographical image, an optical image or a photoluminescence image, then saving in a memory the captured image and the spatial coordinates of the corresponding surface region.

Another subject matter of the invention is a micro/nanostructure formed of colloidal nanoparticles comprising:

an electret substrate composed of an electret material and having a free receiving surface, in which a surface electric potential is written on the receiving surface of the electret substrate according to a pattern of positive and/or negative electric charges, an assembly of colloidal nanoparticles which are attached to the electret substrate, having a geometric shape, characterized in that:

the colloidal nanoparticles are electrically neutral or quasineutral and electrically polarizable under the action of an external electric field, and the polarizable nanoparticles are positioned as a monolayer or multilayers, being directly bonded to one another and/or to the substrate under the action of dielectrophoretic forces created by the interaction existing between the polarizable nanoparticles and the surface potential of the pattern of charges, and the pattern of electric charges of the same polarity written in the electret substrate corresponds to the geometric shape of the monolayer or multilayer assembly of nanoparticles, and the absolute value of the surface electric potential created by the pattern of charges is greater than or equal to a first surface electric potential threshold which depends on the nature of the polarizable nanoparticles and such that at least the first layer of the assembly of colloidal nanoparticles is compact in terms of absence of undesired gaps with a size greater than the size of two adjacent nanoparticles, preferably greater than the size of one nanoparticle.

According to specific embodiments, the micro/nanostructure formed of colloidal nanoparticles comprises one or more of the following characteristics:

the absolute value of the surface electric potential created by the pattern of charges is greater than or equal to a third threshold which depends on the nature of the polarizable nanoparticles, and such that the assembly is multilayer.

Another subject matter of the invention is a micro/nanostructure formed of colloidal nanoparticles of two different types comprising, in the form of a binary assembly, an electret substrate composed of an electret material and having a free receiving surface, a first monolayer or multilayer assembly of colloidal nanoparticles of the first type, which are attached to the electret substrate, a second monolayer or multilayer assembly of colloidal nanoparticles of the second type, which are attached to the electret substrate, characterized in that:

the electret substrate comprises a surface electric potential written on the receiving surface of the electret substrate according to a predetermined pattern of electric charges having a first sign and having a second sign opposite the first sign, the pattern of charges being composed of a first subpattern of charges of the first sign and of a second subpattern of charges of the second sign, and the nanoparticles of the first type forming the first monolayer or multilayer assembly are either electrically charged according to the second sign and bonded to the electret substrate under the action of Coulomb forces created by the interaction existing between the nanoparticles of the first type and the surface potential of the first subpattern of charges written in the electret substrate or substantially neutral and electrically polarizable and bonded to one another and/or to the substrate under the action of dielectrophoretic forces created from the interaction existing between the nanoparticles of the second type and the surface potential of the first subpattern of charges written in the electret substrate, and the colloidal nanoparticles of the second type forming the second monolayer or multilayer assembly are electrically neutral or quasineutral and electrically polarizable under the action of an external electric field and bonded to one another and/or to the substrate under the action of dielectrophoretic forces created from the interaction existing between the nanoparticles of the second type and the surface potential of the second subpattern of charges written in the electret substrate, and the second subpattern of electric charges of the second sign written in the electret substrate corresponds to the geometric shape of the second monolayer or multilayer assembly of nanoparticles, and the absolute value of the surface electric potential created by the pattern of charges is greater than a first surface electric potential threshold which depends on the nature of the polarizable nanoparticles, and such that at least the first layer of the second assembly of colloidal nanoparticles is compact in terms of absence of undesired gaps with sizes greater than or equal to the size of two adjacent nanoparticles, preferably greater than or equal to the size of one nanoparticle.

According to specific embodiments, the micro/nanostructure formed of colloidal nanoparticles of two different types comprises one or more of the following characteristics:

the nanoparticles of the first type and the nanoparticles of the second type respectively have a first size and a second size, and the first and second assemblies respectively have a first number and a second number of layers, and the product of the first number of layers by the first size and the product of the second number of layers by the second size are substantially equal, and the shapes of the first and second subpatterns of voltage in terms of intensity coding, of sign of the potential on the receiving surface of the electret substrate are configured so that the first and second geometric shapes respectively of the first assembly and of the second assembly are conjugate shapes and have substantially the same height with respect to the receiving surface of the substrate, thus rendering the geometric shape of the first assembly and the geometric shape of the second assembly undetectable separately topographically by AFM and/or by optical microscopy using illumination in the visible spectrum; and the nanoparticles of the first type have the property of converting radiation in the near infrared (NIR) spectrum into radiation in a first visible spectrum and the nanoparticles of the second type have the property of converting the same radiation in the near infrared (NIR) spectrum into radiation in a second visible spectrum, the first visible spectrum being different from the second visible spectrum.

Another subject matter of the invention is a label for anticounterfeiting marking and/or for traceability and/or for authentication comprising a micro/nanostructure of colloidal nanoparticles which is as defined above or which is obtained by the process as defined above.

A better understanding of the invention will be obtained and other advantages of the invention will become more clearly apparent on reading the description which will follow of several embodiments of the invention, which description is given solely by way of example and is made with reference to the appended drawings, in which:

FIG. 5 is a view of the relationship existing between the height of the assemblies of polarizable neutral nanoparticles and the absolute value of the surface potential of the patterns of charges written, this being for different concentrations of the same colloidal dispersion;

FIG. 6 is a topographical view of a directed assembly formed of charged nanoparticles;

FIG. 7 is a view of the correlation existing between the height of assemblies of polarizable neutral luminescent nanoparticles and the relative luminescence intensity;

FIG. 8 is a combination of an AFM topographical view and of a viewed coded in intensity of luminescence of a three-dimensional assembly of neutral and polarizable luminescent colloidal nanoparticles;

Figure 16:
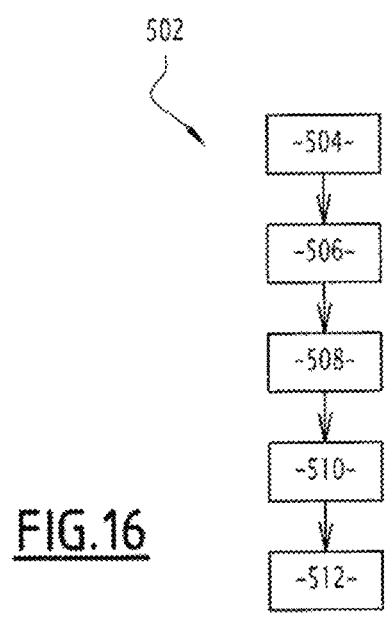
Figure 10:
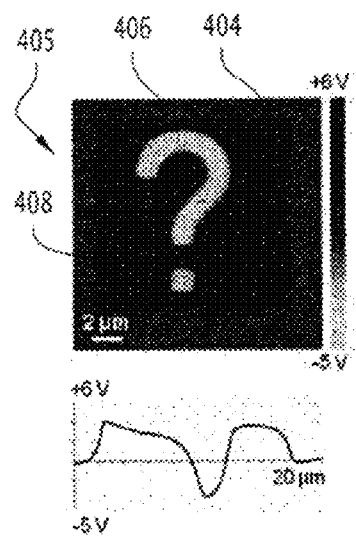
Figure 11:
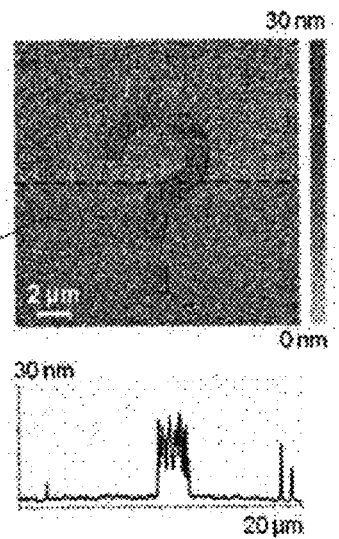
Figure 12:
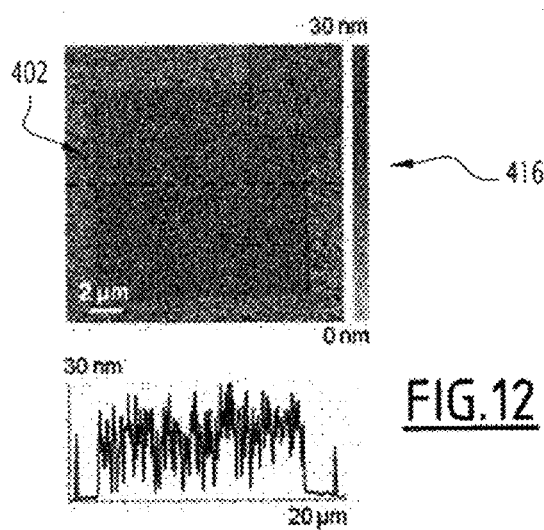
Figure 13:
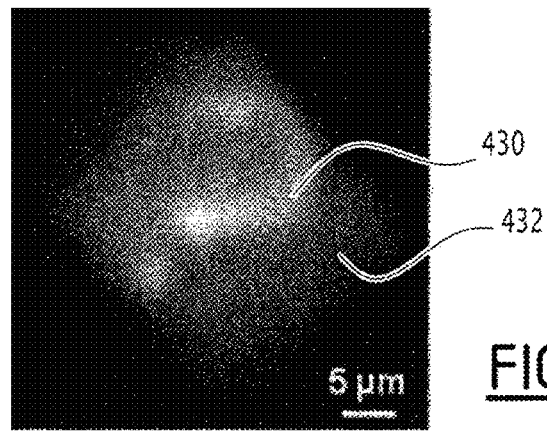
Figure 14:
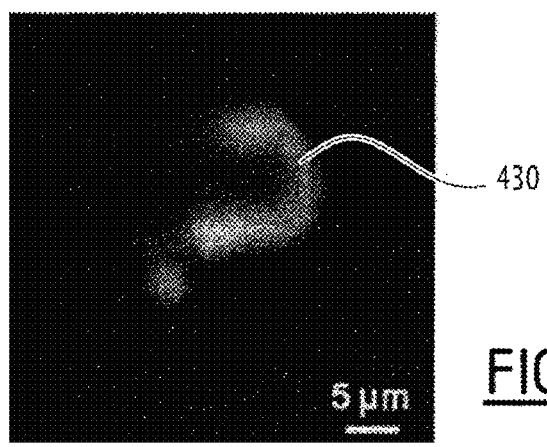
Figure 15:
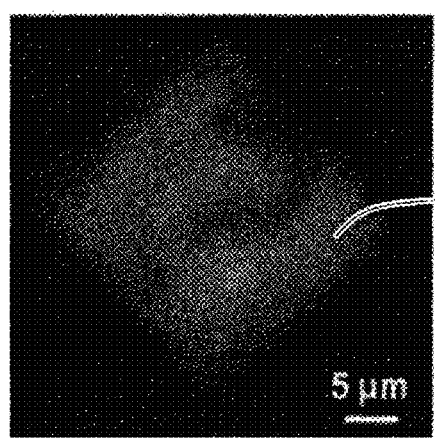
Figure 17:
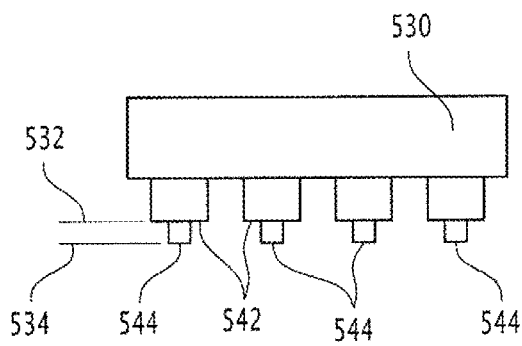
Figure 18:
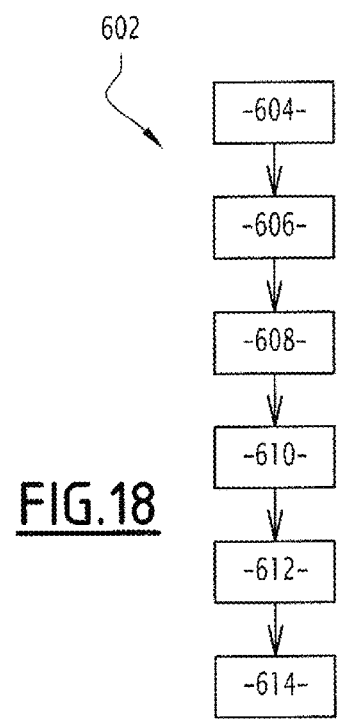
Figure 19:
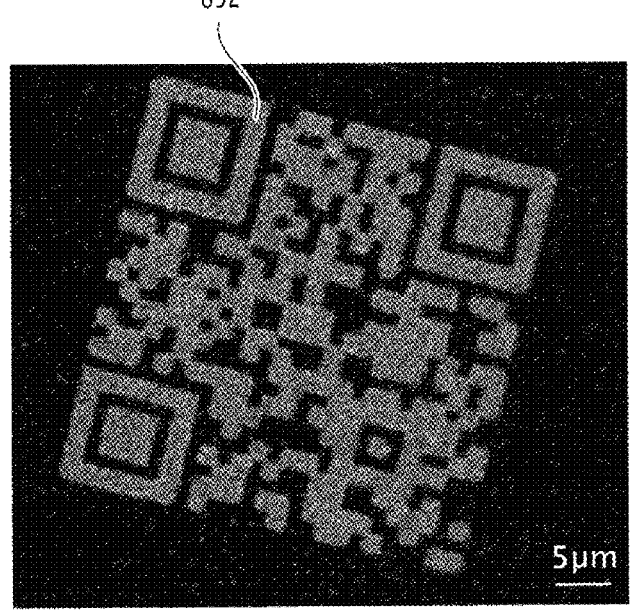

FIGS. 10, 11 and 12 are the views of different phases of production of a binary assembly of two types of nanoparticles, respectively the KFM image of a pattern of charges composed of a first subpattern and of a second subpattern of charges of opposite signs and of conjugate shapes, the AFM topographical image of the development of the first subpattern and the AFM topographical image of the development of the whole pattern in which the boundary of the first and second subpatterns is undetectable;

FIGS. 13, 14 and 15 are photoluminescence mappings of the assemblies of FIG. 12, respectively appropriate to the optical spectrum of the two subpatterns, to the optical spectrum of the first subpattern alone and to the spectrum of the second subpattern alone;

FIG. 16 is a flowchart of a first embodiment of the manufacture of a binary assembly according to the invention;

FIG. 17 is a view of a stamp, used to write, in parallel and successively, charges of a first sign and then charges of a second sign, or charges of the same type but with different densities;

FIG. 18 is a flowchart of a second embodiment of the manufacture of a binary assembly according to the invention;

FIG. 19 is a view by optical microscopy of a three-dimensional QR (Quick Response) code produced by a process of the invention.

Figure 1:
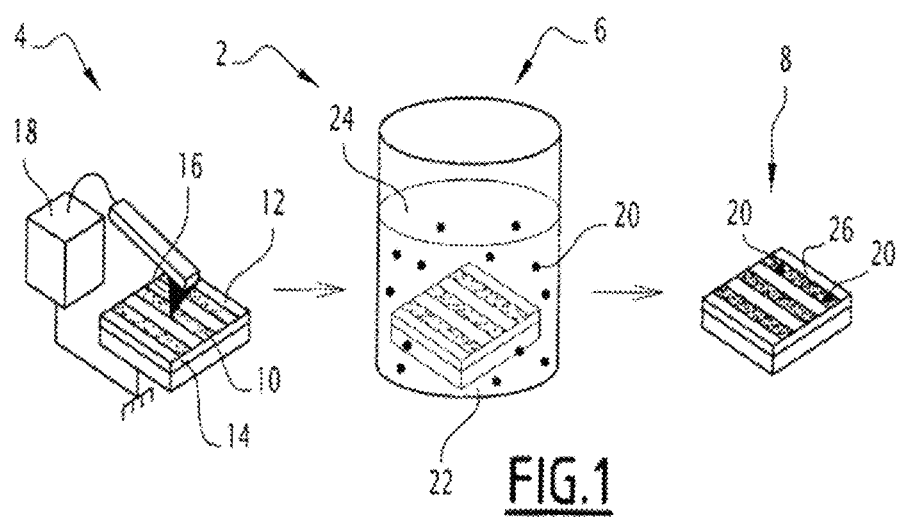
FIG. 1 is a view of a process for the manufacture of a micro/nanostructure according to the invention.

According to FIG. 1, an atomic force microscopy AFM nanoxerography process 2, used to assemble, in directed fashion, β-NaYF$_4$ colloidal nanocrystals stabilized by oleates and doped with lanthanides from their dispersions in hexane, comprises a first stage 4, a second stage 6 and a third stage 8, carried out successively.

In the first stage 4, patterns 10 of electric charges are written by sequentially injecting, according to points, positive and/or negative charges on a receiving surface 12 of an electret substrate 14, in this instance a polymethyl methacrylate (PMMA) film with a thickness of 100 nanometers, using an AFM tip 16 polarized under ambient conditions and supplied by a voltage generator 18.

The first stage 4 is carried out for a writing period typically of between a few seconds and a few minutes, depending on the complexity of the patterns of charges written.

In the second stage 6, the electret substrate 14, the receiving surface 12 of which is written with the patterns 10 of electric charges, is brought into contact for a contacting time, in this instance equal to 30 seconds, with a dispersion 20 of the colloidal nanocrystals 22 dispersed in the solvent 24, in this instance hexane.

The contacting operation represented in FIG. 1 is carried out in this instance by complete immersion of the electret substrate for an incubation time in the dispersion 20.

In an alternative form, the contacting operation is carried out by the deposition of a drop of the dispersing solvent on the receiving surface written with the patterns of electric charges for an incubation time. This alternative form is carried out with the proviso that the surface of the patterns has a size compatible with the size of the solvent drop and that the solvent is not excessively volatile.

In an alternative form, the dispersing solvent is replaced by a nonpolarizing dispersing gas.

In the third stage 8, the electret substrate 14 on which nanocrystals have been deposited in the form of linear patterns 26, is dried under ambient conditions, that is to say under a pressure of approximately one atmosphere and at a temperature in the vicinity of 25° C.

Figure 2:
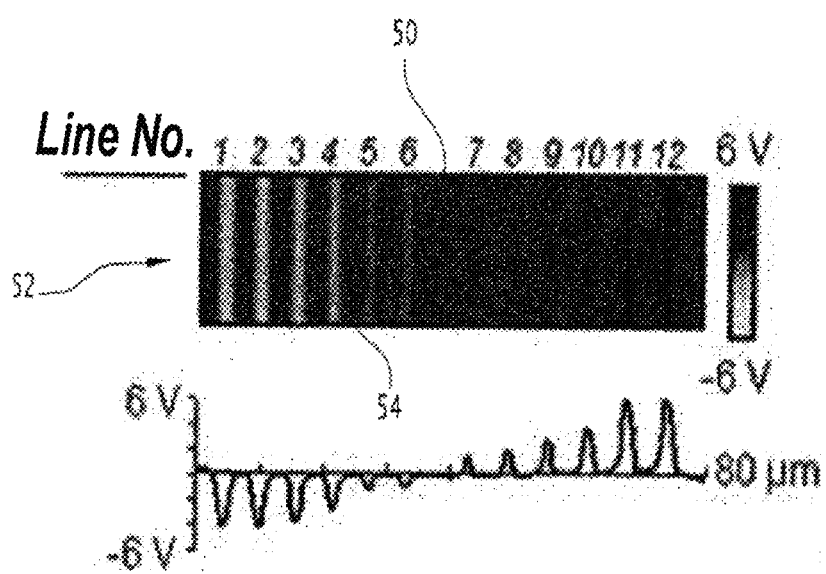
FIG. 2 is a view by Kelvin Force Microscopy (KFM) of a series of lines of negative and positive electric charges injected into an electret substrate.

According to FIG. 2, a chart 50 of the surface potential observed by Kelvin Force Microscopy (KFM) comprises a sequence 52 of 12 lines 54 with a surface potential increasing algebraically from left to right over FIG. 2, the surface potential lines 54 being numbered from 1 to 12 going toward the right of FIG. 2.

The first six surface potential lines 1 to 6 correspond to written negative charges and the final six surface potential lines 7 to 12 correspond to written positive charges.

The surface potential lines 54 correspond to lines written during stage 4 of FIG. 1 by the AFM technique using voltage pulses varying from −85V to +85V.

It should be pointed out that the stage 4 of writing electric charges does not change the topography of the PMMA electret film.

Figure 3:
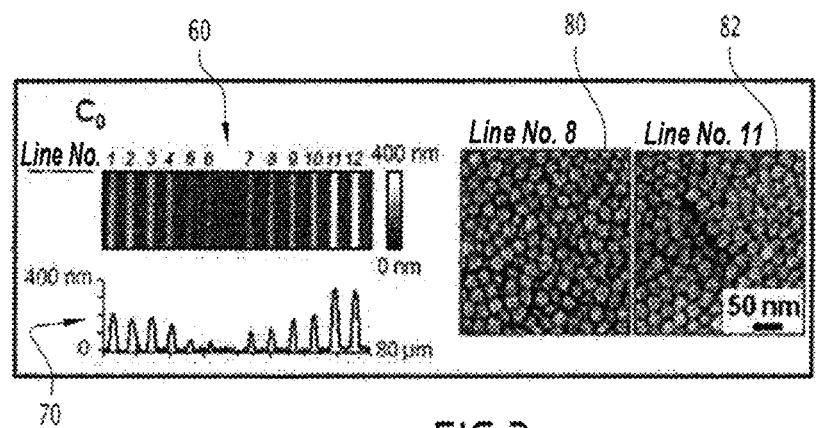
FIGS. 3 and 4 are AFM and scanning electron microscopy (SEM) images of assemblies of nanoparticles developed according to the patterns of charges described in FIG. 2 at two respective concentrations $C_0$ and $C_0/40$.
Figure 4:
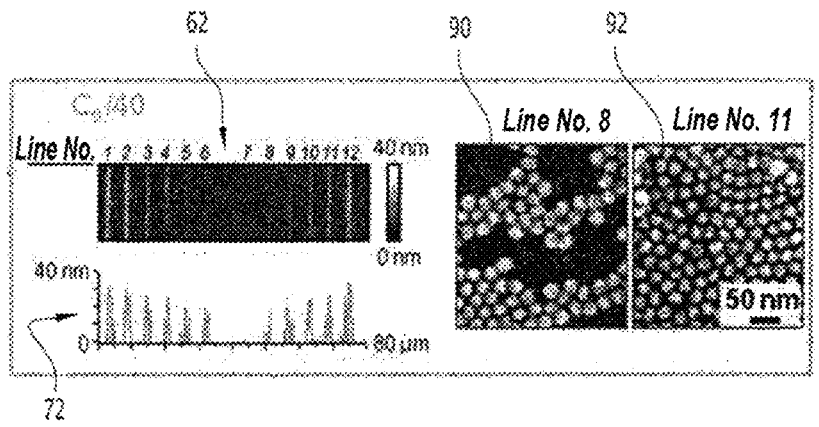

According to FIGS. 3 and 4, the effects of the surface potential of the patterns of charges and of the concentration of the β-NaYF$_4$:Er$^{3+}$,Yb$^{3+}$ colloidal nanocrystals dispersed in hexane on the morphologies of the assemblies of nanocrystals obtained by the process 2 of FIG. 1, are evaluated and represented.

In FIGS. 3 and 4, the same chart of surface potential as described in FIG. 2 was used.

In FIGS. 3 and 4, β-NaYF$_4$:Er$^{3+}$,Yb$^{3+}$ nanocrystals, with up-conversion in the green region, of spherical shape and with a diameter of 22 nanometers, dispersed in hexane, are used during stage 6 of FIG. 1 at two concentrations respectively different, at $C_0$ equal to 7.8×10$^{12}$ NCs/mL for FIG. 3 and at $C_0/40$=1.9×10$^{11}$ NCs/mL for FIG. 4.

Each FIGS. 3 and 4 respectively comprises an AFM topographical image 60, 62 of the corresponding directed assembly of nanocrystals, an analysis of the corresponding cross section 70, 72 and two images by scanning electron microscopy (SEM) 80, 82, 90, 92 of the assembly of the nanoparticles over two lines of charges which are representative, the lines numbered 8 and 11.

According to FIG. 3, when the patterns of charges are developed by using NaYF$_4$ nanocrystals at the concentration $C_0$, which is sufficiently high to regard the dispersion as an infinite reservoir of colloidal nanocrystals, multilayer and compact assemblies of nanoparticles are formed both on the lines of positive and negative charges, the mean height of which gradually increases with the absolute value of the surface potential of the patterns of charges.

According to FIG. 4, when the concentration of the dispersion of nanoparticles decreases by a factor of 40, that is to say is equal to $C_0/40$, only monolayer assemblies of nanocrystals are formed on the lines of positive and negative charges, independently of their surface potentials. However, an increase in the density of the nanocrystals takes place when the absolute value of the surface potential of the lines of charges increases.

As represented in the SEM images 90, 92, these monolayer assemblies of colloidal nanocrystals form islets of colloidal nanoparticles in the image 90, which corresponds to a line 8 of charges having a surface potential strictly less than a certain threshold, and form a compact mass of colloidal nanoparticles packed as close as possible in image 92, which corresponds to a line 11 of charges having a surface potential greater than or equal to said certain threshold.

According to FIG. 5, there exists a relationship of linear dependence between the mean height of the assemblies of colloidal nanocrystals and the absolute value of the surface potential of the lines of charges and also the concentration of colloidal nanocrystals. The mean height observed for the assemblies of colloidal nanocrystals obtained for concentrations of nanocrystals of greater than or equal to $C_0$ corresponds well to the height theoretically calculated for compact filling of nanocrystals arranged according to a face-centered cubic unit cell arrangement or a hexagonal unit cell arrangement, these theoretical heights being represented by finely dotted lines 102. The height of the assemblies can be monitored and controlled from a height of approximately 25 nm, corresponding to a monolayer of NaYF$_4$ colloidal nanocrystals, up to a maximum height of 350 nm, corresponding to fifteen layers of NaYF$_4$ colloidal nanocrystals, due to the limitation of the surface potential written in the present case. The minimum concentration of colloidal nanocrystals required in order to obtain the maximum height for a given charge potential is equal to 3.9×10$^{12}$ NCs/mL in this case.

It should be pointed out that the change in the mean height of the assemblies of colloidal nanoparticles as a function of the surface potential of the lines of charges is essentially symmetrical on the two positive and negative sides of the axis of the potential. In other words, the height of the assembly of the colloidal nanoparticles depends on the absolute value of the surface potential of the lines of charges and does not depend on its sign. This indicates that the NaYF$_4$ colloidal nanocrystals, which are electrically quasineutral, have been electrically polarized under the action of the gradient of the electric field, which is nonuniform and created by the patterns of charges written, and are trapped by these patterns under the action of dielectrophoretic forces solely.

FIG. 6 comprises an AFM topographical image 110 and a plot 112 of two cross sections, respectively corresponding to a rectangular written pattern of negative charges which is located in the upper half of FIG. 6 and to a rectangular written pattern of positive charges which is located in the lower half of FIG. 6.

According to FIG. 6 and in a way different from what is described in FIGS. 1 to 5, a solution of positively charged β-NaYF$_4$:Er$^{3+}$,Yb$^{3+}$ colloidal nanocrystals dispersed in water at a concentration of 1.0×10$^{13}$ NCs/mL makes it possible to obtain directed monolayer assemblies of colloidal nanocrystals deposited only on the negatively charged patterns (i.e., with an opposite charge to the nanocrystals), in this instance a single pattern 114 in FIG. 6, independently of the surface potential of the patterns of charges or of the concentration of colloidal nanocrystals. The assembly of colloidal nanocrystals in this case is guided exclusively by Coulomb forces, that is to say an attraction of the colloidal nanocrystals to the pattern of opposite charges and a repulsion of the colloidal nanocrystals from the pattern of the same charges. Unlike the invention, these assemblies are never organized into compact structures of colloidal nanoparticles packed as close as possible, due to the electrostatic repulsion forces existing between the charged nanocrystals.

Thus, according to the invention, the density of colloidal nanoparticles on the patterns of charges varies with and is regulated as a function of the surface potential of the patterns of charges and of the concentration of electrically polarizable neutral nanoparticles.

The results relating to the invention, as described above, indicate that, generally, an assembly of substantially neutral and electrically polarizable β-NaYF$_4$ colloidal nanocrystals, which are directed starting from electrostatic forces from their dispersion to the patterns of charges, is governed by (i) the surface potential of the pattern of charges, (ii) the concentration of the nanocrystals in the dispersion and (iii) the polarity of the dispersing solvent.

These results are not limited to the β-NaYF$_4$ nanocrystals and can be generalized to a broader list of colloidal nanoparticles. Neither is the formation of multilayer assemblies of nanoparticles limited to β-NaYF$_4$ nanoparticles. For example, multilayer assemblies can also be obtained for gold nanoparticles dispersed in hexane dispersions.

FIG. 7 comprises an AFM topographical image 200 of six assemblies of neutral and polarizable β-NaYF$_4$:Er$^{3+}$,Yb$^{3+}$ nanocrystals with different heights and a plot 201 of change in the photoluminescence intensity as a function of the height of these assemblies of photoluminescent nanocrystals.

According to FIG. 7, the relationship of dependence existing between the height of six assemblies 202, 204, 206, 208, 210, 212 of β-NaYF$_4$:Er$^{3+}$,Yb$^{3+}$ colloidal nanocrystals and their luminescence property is thus illustrated.

The assemblies 202, 204, 206, 208, 210, 212 are directed assemblies of β-NaYF$_4$:Er$^{3+}$,Yb$^{3+}$ colloidal nanocrystals on patterns of charges written on 5 μm×5 μm squares, the surface potentials of which increase from left to right in the image 200 of FIG. 7. Correspondingly, the height of the assemblies 202, 204, 206, 208, 210, 212 varies from 20 nm to 280 nm. The luminescence, resulting from the up-conversion of the assemblies of nanoparticles when they are excited by a laser diode having a continuous carrier wave with a wavelength of 980 nm, corresponds to that obtained from dispersions using hexane as dispersing solvent. As represented in the plot 201 of FIG. 7, the luminescence intensity of the up-conversion in the visible green region (corresponding to a wavelength of 525/545 nm) of the assemblies of the colloidal nanocrystals gradually increases as a function of their height. Clearly, the luminescence intensity resulting from the up-conversion increases when the number of emitters, formed by the nanocrystals, increases.

The control offered by AFM nanoxerography with regard to the architecture of the assembly, in terms of any geometric shape desired for the pattern or patterns and of the height of the assembly, make it a technique suitable for the construction of anticounterfeiting and/or traceability and/or authentication labels. The anticounterfeiting function of a label when the label is provided with such a function has one or more levels of high security.

According to FIG. 8, a topographical image 250 by AFM microscopy and an optical luminescence image 252 of a multilayer three-dimensional assembly 254 of colloidal nanocrystals exhibiting the novel form of a smiley are provided.

The colloidal nanocrystals of the assembly 254 are β-NaYF$_4$:Er$^{3+}$,Yb$^{3+}$ colloidal nanoparticles with a diameter of 22 nm and which are stabilized in oleate. The nanocrystals are deposited on a pattern of charges having the shape of the smiley.

In this assembly, the height of the outline and the height of the characteristic dashes of the face of the smiley are respectively equal to 100 nm and 350 nm.

According to FIG. 8, a plot 260 of the change in the luminescence intensity of the assembly 254 the length of a cutting line denoted by 262 in the photoluminescence image 252 and a plot 264 of the height of the assembly the length of the same corresponding cutting line denoted by 266 in the AFM topographical image 250 are provided.

The relative luminescence intensities for conversion which are emitted from the different parts of the assembly are very well correlated with the height measured by the analysis of the cross section of the AFM topographical image according to the plot 264.

Figure 9:
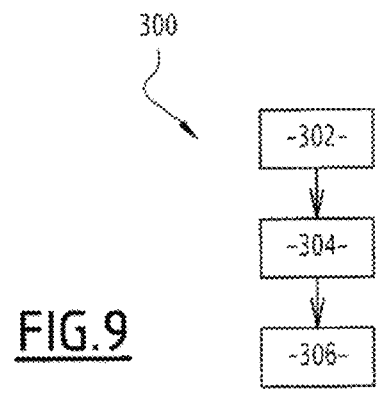
FIG. 9 is a flowchart of a process according to the invention for the manufacture of a directed assembly of nanoparticles of the same type.

Generally and according to FIG. 9, a process 300 for the manufacture of a micro/nanostructure formed of colloidal nanoparticles comprising a monolayer or multilayer assembly of colloidal nanoparticles which are attached to an electret substrate, having a freely chosen and predetermined geometric shape, at least the first layer of which is compact in terms of absence of undesired gaps with sizes of greater than or equal to the size of two adjacent nanoparticles, preferably greater than or equal to the size of one particle, comprises a sequence of stages 302, 304, 306.

In a first stage 302, an electret substrate composed of an electret material and having a free receiving surface is provided.

Then, in a second stage 304, a surface electric potential is written on the receiving surface of the electret substrate according to a predetermined pattern of electric charges with the same sign and/or with opposite signs corresponding to the monolayer or multilayer assembly of nanoparticles which it is desired to obtain.

Subsequently, in a third stage 306, the electret substrate, having the receiving surface written with the surface potential according to the desired pattern of electric charges, is brought into contact with a colloidal dispersion for a contacting time.

The colloidal dispersion comprises electrically neutral or quasineutral colloidal nanoparticles which are electrically polarizable under the action of an external electric field and a dispersing medium in the form of a liquid solvent or a gas, substantially devoid of an electrical polarization action, in which the colloidal nanoparticles are dispersed.

The absolute value of the surface electric potential and the concentration of polarizable nanoparticles are respectively greater than or equal to a first surface electric potential threshold and a second concentration threshold, the first and second thresholds each depending on the nature of the dispersing medium and on the nature of the polarizable nanoparticles, so that, after a contacting time which is sufficiently long and less than 15 minutes, the micro/nanostructure obtained is a monolayer or multilayer micro/nanostructure having the desired geometric shape, at least the first layer of which is compact in terms of absence of undesired gaps with sizes of greater than or equal to the size of two adjacent nanoparticles, preferably greater than or equal to the size of one nanoparticle, the nanoparticles being bonded to one another and/or to the substrate under the action of dielectrophoretic forces created from the interaction between the polarizable nanoparticles and the written surface potential.

In an alternative form, the absolute value of the surface electric potential and the concentration of polarizable nanoparticles are respectively greater than or equal to a third surface electric potential threshold and greater than or equal to a fourth concentration threshold, the third and fourth thresholds each depending on the nature of the dispersing medium and on the nature of the polarizable nanoparticles, so that, after a contacting time which is sufficiently long and less than fifteen minutes, the micro/nanostructure obtained is the multilayer micro/nanostructure having the desired geometric shape, at least the first layer of which is compact in terms of absence of undesired gaps with sizes of greater than or equal to the size of two adjacent nanoparticles, preferably greater than or equal to the size of one nanoparticle, the nanoparticles being bonded to one another and/or to the substrate under the action of dielectrophoretic forces created from the interaction between the neutral and electrically polarizable nanoparticles and the written surface potential.

In an alternative form, the assembly of colloidal nanoparticles which are attached to an electret substrate, having a freely chosen and predetermined geometric shape, is a multilayer assembly of a certain number NI of layers, each of the layers of which is compact in terms of absence of undesired gaps with sizes of greater than or equal to the size of two adjacent nanoparticles, preferably greater than or equal to the size of one nanoparticle.

The surface electric potential and the concentration of polarizable nanoparticles are respectively greater than or equal to a fifth surface electric potential threshold and greater than or equal to a sixth concentration threshold, the fifth and sixth thresholds each depending on the nature of the dispersing medium, on the nature of the polarizable nanoparticles and on the number of layers, so that, after a contacting time which is sufficiently long and less than 15 minutes, the micro/nanostructure obtained is the multilayer micro/nanostructure having the desired geometric shape, all the layers of which are compact, the nanoparticles being bonded to one another and/or to the substrate under the action of dielectrophoretic forces created from the interaction between the polarizable nanoparticles and the written surface potential.

The colloidal nanoparticles have physical properties included within the group formed by plasmonic, conducting, magnetic, luminescent, catalytic, electrochromic and photochromic properties.

For example, the colloidal nanoparticles each carry a lanthanide capable of converting radiation in the near infrared (NIR) spectrum into radiation in a visible spectrum.

In an alternative form, the stage of writing the patterns of charges on the receiving surface of the electret substrate can be carried out according to preference by a process of sequential writing of electric charges on the electret substrate or a process of writing in parallel of electric charges on the electret substrate.

A process of sequential writing is included within the group formed by writing of electric charges by a beam of focused ions, writing electric charges by a beam of focused electrons, writing of electric charges by atomic force microscopy (AFM) and writing of electric charges by electrophotography (also known as xerography).

It should be pointed out that the writing of electric charges by atomic force microscopy (AFM) advantageously makes it possible to write, in a single uninterrupted stage or in a single pass, a pattern of charges comprising both positive charges and negative charges.

A process of writing in parallel is included within the group formed by electrical nanoimprinting and electrical microcontact.

In an alternative form, a surface region of the sample of the electret substrate on which the assembly has been formed is chosen from the receiving surface of the electret substrate outside the assembly. During the operation in which the solution is brought into contact with the charged substrate, nanoparticles in a reduced amount become attached in a chance and uncontrolled manner to this chosen surface region, in the form of a structure resulting from deposition noise, having a distribution which is not very dense in terms of compactness, random and dependent on the sample of the electret substrate on which the assembly has been formed. In a first locating stage, the surface region is located by spatial coordinates in a reference frame attached to the electret substrate. In a second stage, an image of the random structure of the nanoparticles which are attached in the chosen surface region and forming a signature is captured. The captured image is according to preference an AFM topographical image, an image by optical microscopy or a photoluminescence image. The captured image and the spatial coordinates of the chosen surface region are saved in a storage memory.

Generally, the electret material is a material included within the group formed by polymethyl methacrylates (PMMA), cyclic olefin copolymers (COC), polyethylene terephthalates (PET), polydimethylsiloxanes (PDMS), polypropylenes (PP), polycarbonates (PC), polystyrenes (PS), polyvinyl chlorides (PVC), polytetrafluoroethylenes (PFTE), triglycine sulfate (TGS), polyvinylidene fluoride (PVDF), silicon nitride ($Si_3N_4$), silicon oxide ($SiO_2$), or the compound $Si_3N_4/SiO_2/Si$ (NOS).

Generally, the colloidal nanoparticles are compounds stabilized by themselves or by ligands and/or charges, having physical properties included within the group formed by plasmonic, conducting, magnetic, luminescent, catalytic, electrochromic or photochromic properties, rendered substantially neutral and electrically polarizable, produced from base colloidal nanoparticles.

The base colloidal nanoparticles having a solid core and, if appropriate, a shell and being included within the group formed by the latex, $SiO_2$, $TiO_2$, $ZrO_2$; CdS, CdSe, PbSe, GaAs, GaN, InP, $In_2O_3$, ZnS, ZnO, $MoS_2$, Si, C, ITO, $Fe_2O_3$, $Fe_3O_4$, Co, Fe—Co, $Fe_3C$, $Fe_5C_2$, Ni; Au, Ag, Cu, Pt, and the bimetallic nanoparticles; $WO_3$; $NaLnF_4$, the lanthanide fluorides ($LnF_3$), the lanthanide oxides ($Ln_2O_3$), the zirconates, silicates, hydroxides ($Ln(OH)_3$) and the sulfides of oxides doped or not doped with one or more different lanthanides (Ln denoting a lanthanide), and the mixtures of these compounds.

When the dispersing medium is a nonpolarizing liquid solvent, the solvent is included within the group formed by pentane, isopentane, hexane, heptane, octane, nonane, decane, cyclopentane, cyclohexane, cycloheptane, cyclooctane, cyclohexene, benzene, toluene, methylcyclohexane, xylene, mesitylene, chloroform, methylene chloride or tetrachloroethylene.

When the dispersing medium is a nonpolarizing dispersing gas, the dispersing gas is included within the group formed by molecular nitrogen $N_2$, argon Ar, and air.

According to FIGS. 10, 11 and 12, the writing of charges by AFM can also be used to produce binary assemblies of colloidal nanoparticles with a precisely controlled and monitored placement of two types of colloidal nanoparticles. This type of binary assembly offers a high degree of security for traceability and anticounterfeiting marks.

According to FIGS. 10, 11 and 12, a binary assembly 402 was manufactured using a pattern of charges 404 comprising both positive charges and negative charges and dispersions of nanoparticles based on β-NaYF$_4$ which are different in their electric charges, their degrees of polarizability, their concentrations and their up-conversion emission bands. The binary assembly 402 manufactured thus makes it possible to obtain a micropattern coded in colors.

According to FIG. 10, a KFM image 405 of the surface potential of the micropattern 404 of charges which is used to create the binary assembly 402 is provided.

The micropattern 404 of charges which is used to create the binary assembly consists of a mark 406, having the form of a negatively charged question mark with a width of 1.5 µm, in contrast with a positively charged square background 408 with a side length of 15 µm. The micropattern 404 was developed by successively using two different dispersions of colloidal nanocrystals: (i) a first dispersion of a first type of nanoparticle, β-NaYF$_4$:Gd$^{3+}$,Er$^{3+}$,Yb$^{3+}$/NaYF$_4$ core/shell nanocrystals, with an up-conversion into green light, which are positively charged and dispersed in water, and (ii) a second dispersion of a second type of nanoparticle, β-NaYF$_4$:Gd$^{3+}$,Tm$^{3+}$,Yb$^{3+}$/NaYF$_4$ core/shell nanocrystals, with an up-conversion into blue light, which are electrically quasineutral and dispersed in hexane. Both types of nanocrystals are in this instance of similar sizes and both types of colloidal nanoparticles can be optically pumped by the same source of optical excitation due to the fact that both types of nanoparticles comprise Yb$^{3+}$ as energy transfer agent.

According to FIG. 11, an AFM topographical image 412 of the pattern of charges developed first at a first stage 414 by using the first aqueous dispersion shows the positively charged nanoparticles of the first type selectively deposited according to a monolayer on the mark of the negatively charged question mark 406 as pattern of charges.

After drying under nitrogen and removing the traces of the solvent from the first dispersion, the pattern of charges is developed at a second stage by using the second dispersion having hexane for solvent. During this second stage of the development, the nanoparticles of the second type, that is to say the nanoparticles for up-conversion in blue light, are selectively deposited according to a monolayer on the positively charged background 408 of the electret substrate and forming a portion of the pattern of charges. This selectivity originates from the fact that the surface potential of the pattern 406 corresponding to the question mark covered with the monolayer of the nanoparticles of the first type is insufficient to make possible a second deposition by and an attachment of the nanoparticles of the second type having a concentration suitable for this effect.

It should be pointed out that the surface potential of the positively charged background has been finely adjusted by the writing of charges by AFM in order to obtain a density of colloidal nanoparticles of the second type, which is similar, indeed even identical, to that of the nanoparticles of the first type deposited and attached by Coulomb force to the mark of the question mark. Thus, the mark of the question mark cannot be noticed topographically and distinguished from the background by an optical microscope.

According to FIG. 12, the analysis of the topographical image 416 by AFM of the final assembly 402 does not make it possible to detect the boundaries of the mark of the question mark with respect to the background. Thus, information encoded in the pattern 402 is indeed hidden in or melted into the background.

This encoded information can be subsequently recovered through imaging by luminescence.

According to FIG. 13, when the developed mark 430 of the question mark is observed in the visible region without filtering by being excited by a laser diode in the near infrared (NIR) region with a wavelength of 980 nm, the developed mark 430 appears brighter than the developed background 432 due to a higher yield of the up-conversion by the β-NaYF$_4$:Gd$^{3+}$,Er$^{3+}$,Yb$^{3+}$/NaYF$_4$ nanocrystals of the first type (two-photon process) than the yield of the up-conversion by the β-NaYF$_4$:Gd$^{3+}$,Tm$^{3+}$,Yb$^{3+}$/NaYF$_4$ nanocrystals of the second type (three-photon process).

According to FIGS. 14 and 15, the emissions of the nanocrystals of the two types can be effectively separated by using filters in the visible region appropriate for revealing the colors encoded in the pattern of the binary assembly, respectively a selective filter for the blue region (corresponding to a wavelength of 485 nm) and a selective filter for the green region (corresponding to a wavelength of 550 nm).

Generally and according to a first embodiment of FIG. 16, a process 502 for the manufacture of a binary micro/nanostructure formed of two types of colloidal nanoparticles comprises an assembly of stages 504, 506, 508, 510 and 512 which are carried out successively.

The binary micro/nanostructure formed of two types of colloidal nanoparticles comprises a first monolayer assembly of colloidal nanoparticles of the first type, which are attached to an electret substrate, having a first freely chosen and predetermined geometric shape, and a second monolayer or multilayer assembly of colloidal nanoparticles of the second type, which are attached to an electret substrate, having a second freely chosen and predetermined geometric shape, at least the first layer of which is compact in terms of absence of undesired gaps with sizes greater than or equal to the size of two adjacent nanoparticles.

In a first stage 504, an electret substrate composed of an electret material and having a free receiving surface is provided.

Then, in a second stage 506, a surface electric potential is written, sequentially or in parallel, on the receiving surface of the electret substrate according to a predetermined pattern of electric charges having a first sign and of electric charges having a second sign opposite the first. The pattern of charges is composed of a first subpattern of charges of the first sign, corresponding to the first monolayer assembly of nanoparticles of the first type, and of a second subpattern of charges of the second sign, corresponding to the second monolayer or multilayer assembly of nanoparticles of the second type.

Subsequently, in a third stage 508, the electret substrate having the receiving surface written with the surface potential is brought into contact with a first colloidal dispersion for a first contacting time.

The first colloidal dispersion comprises nanoparticles of the first type which are electrically charged according to the second sign and a first dispersing medium in the form of a liquid solvent or of a gas.

The first contacting time is sufficiently long to allow the formation, on the first subpattern of charges written in the electret substrate, of the first monolayer assembly of nanoparticles of the first type which are bonded to the substrate under the action of electrophoretic forces created from the Coulomb interaction between the nanoparticles of the first type and the surface potential of the first subpattern of charges, until the desired first geometric shape of the first assembly is obtained.

Then, in a fourth stage 510, the electret substrate and the first assembly, together forming an intermediate microstructure of end of third stage, are dried by removing the first solvent.

Subsequently, in a fifth stage 512, the dried intermediate structure is brought into contact in a second colloidal dispersion for a second contacting time.

The second colloidal dispersion comprises colloidal nanoparticles of the second type, which are electrically neutral or quasineutral and electrically polarizable under the action of an external electric field, and a second dispersing medium in the form of a liquid solvent or of a gas, which is substantially devoid of an electrical polarization action, in which the colloidal nanoparticles of the second type are dispersed.

The absolute value of the surface electric potential and the concentration of nanoparticles of the second type are respectively greater than or equal to a first surface electric potential threshold and greater than or equal to a second concentration threshold, the first and second thresholds each depending on the nature of the second solvent and on the nature of the polarizable nanoparticles of the second type, so that, after the second contacting time, which is sufficiently long and less than 15 minutes, the second assembly obtained is the second monolayer or multilayer assembly having the desired second geometric shape, at least the first layer of which is compact in terms of absence of undesired gaps with sizes greater than or equal to the size of two adjacent nanoparticles, the nanoparticles being bonded to one another and/or to the substrate under the action of dielectrophoretic forces created from the interaction between the polarizable nanoparticles and the surface potential of the second subpattern.

When a process of sequential writing of electric charges of different polarities on the electret substrate is carried out during the second stage, it is included within the group formed by inscription of electric charges by a beam of focused ions, inscription of electric charges by a beam of focused electrons, inscription of electric charges by atomic force microscopy (AFM) and inscription of electric charges by electrophotography (also known as xerography).

When the process of writing in parallel of charges of different polarities on the electret substrate is carried out during the second stage, it is included within the group formed by electrical nanoimprinting and electrical microcontact.

In all cases, it is possible to carry out two successive injections with different electrical polarizations.

It should be pointed out that the sequential writing by AFM nanoxerography advantageously makes it possible to write, in a single uninterrupted stage or in a single pass, a pattern of charges comprising both positive charges and negative charges.

In an alternative form, it is possible to carry out parallel writing by electrical microcontact which uses a single stamp. In this case, a two-level flexible stamp, such as, for example, a stamp 530 made of elastomer and represented in FIG. 17, is used. The stamp 530 made of elastomer comprises two levels of patterns 532, 534, a first 532 and a second 534, the associated first and second surfaces 542, 544 of which are conducting and connected electrically to one another in order to form equipotential surfaces. The associated first and second surfaces 542, 544 respectively correspond to the first subpattern and to the second subpattern of charges.

The first and second surfaces 542, 544 are configured in order to be equipotential surfaces either by metalizing the whole of the lower surface of the stamp, the side walls of junctions of the first and second surfaces 542, 544 included, or by using a bulk conductive stamp.

When writing in parallel of different and opposite charges is carried out, first the stamp is applied to the electret with a first force F1 sufficient to squash the second level 534 of the elastomer stamp and to bring both the first surface 542 and the second surface 544 into contact on the electret, and an injection of charges is carried out with a voltage V1.

Subsequently, by relaxing, the stamp is applied to the electret with a second force F2 of lower intensity, so that only the second level of the elastomer stamp, that is to say only the second surface 544, is in contact with the electret, and an injection of charges is carried out with a second voltage V2 with a polarity opposite that of the first voltage V1 for a period of time sufficient to cancel the charges written under the voltage V1 and to subsequently write the charges of the second pattern.

Generally and according to a second embodiment of FIG. 18, a process 602 for the manufacture of a binary micro/nanostructure formed of two types of colloidal nanoparticles comprises an assembly of stages 604, 606, 608, 610, 612, 614, carried out successively.

In a first stage 604, an electret substrate composed of electret material and having a flat free receiving surface is provided.

Then, in a second stage 606, a first surface electric potential is written sequentially or in parallel on the receiving surface of the electret substrate according to a first predetermined subpattern of electric charges having a first sign, corresponding to a first monolayer or multilayer assembly of nanoparticles of the first type, the first subpattern making up a first part of a pattern of charges which also comprises a second predetermined subpattern of electric charges having a second sign opposite the first sign.

Subsequently, in a third stage 608, the electret substrate having the receiving surface written with the first surface potential is brought into contact with a first colloidal dispersion for a first contacting time.

The first colloidal dispersion comprises nanoparticles of the first type, either electrically charged according to the second sign or substantially neutral and electrically polarizable, and a first dispersing medium in the form of a liquid solvent or of a gas.

The first contacting time is sufficiently long to allow for the formation, on the first subpattern of charges written in the electret substrate, of the first monolayer assembly of nanoparticles of the first type with the desired first geometric shape. The nanoparticles of the first assembly are bonded to the substrate either under the action of electrophoretic forces created from the Coulomb interaction between the nanoparticles of the first type and the surface potential of the first subpattern of charges when nanoparticles of the first type are electrically charged according to the second sign or under the action of dielectrophoretic forces created from the interaction between the polarizable nanoparticles and the surface potential of the first subpattern of charges, until the desired first geometric shape of the first assembly is obtained.

Then, in a fourth stage 610, the electret substrate and the first assembly, together forming an intermediate micro/nanostructure of end of third stage, are dried.

In a following fifth stage 612, a second surface electric potential is written, sequentially or in parallel, on the receiving surface of the electret substrate of the dried intermediate structure and outside the regions covered by the first assembly, according to the second predetermined subpattern of electric charges having the second sign.

Then, in a sixth stage 614, the intermediate structure written with the second surface potential is brought into contact in a second colloidal dispersion for a second contacting time.

The second colloidal dispersion comprises colloidal nanoparticles of the second type, which are neutral or quasineutral and electrically polarizable under the action of an external electric field, and a second dispersing medium in the form of a liquid solvent or of a gas, which is substantially devoid of an electrical polarization action, in which the colloidal nanoparticles are dispersed.

The absolute value of the surface electric potential and the concentration of nanoparticles of the second type are respectively greater than or equal to a first surface electric potential threshold and greater than or equal to a second concentration threshold, the first and second thresholds each depending on the nature of the second dispersing medium and on the nature of the polarizable nanoparticles of the second type, so that, after the second contacting time, which is sufficiently long and less than 15 minutes, the second assembly obtained is the second monolayer or multilayer assembly having the desired second geometric shape, at least the first layer of which is compact in terms of absence of undesired gaps with sizes greater than the size of two adjacent nanoparticles, the nanoparticles being bonded to one another and/or to the substrate under the action of dielectrophoretic forces created from the interaction between the polarizable nanoparticles and the surface potential of the second subpattern.

The process of sequential writing of electric charges of the same sign on the electret substrate, carried out during the second stage 606 or the fifth stage 612, is included within the group formed by writing electric charges by a beam of focused ions, writing electric charges by a beam of focused electrons, writing electric charges by atomic force microscopy (AFM) and writing electric charges by electrophotography (also known as xerography).

The process of writing in parallel of charges of the same sign on the electret substrate is included within the group formed by electrical nanoimprinting and electrical microcontact.

In particular, the colloidal nanoparticles of the first type have the property of converting radiation in the near infrared (NIR) spectrum into radiation in a first visible spectrum and the nanoparticles of the second type have the property of converting radiation in the near infrared (NIR) spectrum into radiation in a second visible spectrum, the first visible spectrum being different from the second visible spectrum.

In particular, the concentration of charged nanoparticles of the first type, the first solvent, the nanoparticles of the first type in terms of size, the first subpattern of charges, the first contacting time, the concentration of polarizable nanoparticles of the second type, the second solvent, the nanoparticles of the second type in terms of size and of polarizability and the second contacting time are chosen in order to obtain the first monolayer assembly having the first geometric shape and the second assembly having the desired second geometric shape, the first and second geometric shapes being conjugate shapes having the same height with respect to the receiving surface of the substrate, so that the geometric shape of the second assembly is undetectable by AFM microscopy or by optical microscopy using illumination in the visible spectrum.

Generally and independently of the process carried out in order to produce it, a microstructure formed of colloidal nanoparticles comprises an electret substrate and an assembly of colloidal nanoparticles.

The electret substrate composed of electret material and having a free receiving surface has written on its receiving surface a surface electric potential according to a predetermined pattern of positive and/or negative electric charges.

The assembly of colloidal nanoparticles which are attached to the electret substrate has a freely chosen and predetermined geometric shape.

The colloidal nanoparticles are electrically neutral or quasineutral and are electrically polarizable under the action of an external electric field.

The polarizable colloidal nanoparticles are positioned as a monolayer or as multilayers by being directly bonded to one another and/or to the substrate under the action of dielectrophoretic forces created by the interaction existing between the polarizable nanoparticles and the surface potential of the pattern of charges.

The pattern of electric charges of the same sign written in the electret substrate corresponds to the geometric shape of the assembly of monolayer or multilayer nanoparticles.

The absolute value of the surface electric potential created by the pattern of charges is greater than or equal to a first surface electric potential threshold which depends on the nature of the polarizable nanoparticles and such that at least the first layer of the assembly of colloidal nanoparticles is compact in terms of absence of undesired gaps with sizes greater than or equal to the size of two adjacent nanoparticles, preferably greater than or equal to the size of one nanoparticle.

In an alternative form, the absolute value of the surface electric potential created by the pattern of charges is greater than or equal to a third threshold which depends on the nature of the polarizable nanoparticles and such that the assembly of colloidal nanoparticles is multilayer.

In an alternative form, the microstructure is formed of colloidal nanoparticles of two different types and comprises, in the form of a binary assembly, an electret substrate, a first monolayer or multilayer assembly of colloidal nanoparticles of the first type and a second monolayer or multilayer assembly of colloidal nanoparticles of the second type.

The electret substrate is composed of electret material and has a free receiving surface.

The colloidal nanoparticles of the first type forming the first assembly are deposited on the electret substrate.

The colloidal nanoparticles of the second type forming the second assembly are deposited on the electret substrate.

The electret substrate comprises a surface electric potential written on the receiving surface of the electret substrate according to a predetermined pattern of electric charges having a first sign and having a second sign opposite the first, the pattern of charges being composed of a first subpattern of charges of the first sign and of a second subpattern of charges of the second opposite sign.

The nanoparticles of the first type forming the first monolayer assembly are either electrically charged according to the second sign and bonded to the electret substrate under the action of Coulomb forces created by the interaction existing between the nanoparticles of the first type and the surface potential of the first subpattern of charges written in the electret substrate or substantially neutral and electrically polarizable and bonded to the electric substrate under the action of dielectrophoretic forces created from an interaction between the polarizable nanoparticles and the surface potential of the first subpattern of charges.

The colloidal nanoparticles of the second type forming the second monolayer or multilayer assembly are electrically neutral or quasineutral and electrically polarizable under the action of an external electric field.

The colloidal nanoparticles of the second type are bonded to one another and/or to the substrate under the action of dielectrophoretic forces created from the interaction existing between the nanoparticles of the second type, which are electrically neutral and polarizable, and the surface potential of the second subpattern of charges written in the electret substrate.

The second subpattern of electric charges of the second sign written in the electret substrate corresponds to the geometric shape of the second monolayer or multilayer assembly of nanoparticles.

The absolute value of the surface electric potential created by the second subpattern of charges is greater than or equal to a first surface electric potential threshold which depends on the nature of the polarizable nanoparticles and such that at least the first layer of the second assembly of colloidal nanoparticles is compact in terms of absence of undesired gaps with sizes greater than or equal to the size of two adjacent nanoparticles, preferably greater than or equal to the size of one particle.

In an alternative form, the charged nanoparticles of the first type and the polarizable neutral nanoparticles of the second type respectively have a first size and a second size.

The first assembly and the second assembly respectively have a first number and a second number of layers and the product of the first number of layers by the first size is substantially equal to the product of the second number of layers by the second size.

The shapes of the first and second subpatterns of voltage in terms of intensity coding and of sign of the potential on the receiving surface of the electret substrate are configured such that the first and second geometric shapes respectively of the first assembly and of the second assembly are shapes which are conjugate with one another and have substantially the same height with respect to the receiving surface of the electret substrate, thus rendering the geometric shape of the second assembly undetectable by AFM or by optical microscopy using illumination in the visible spectrum.

In an alternative form, the nanoparticles of the first type have the property of converting radiation in the near infrared (NIR) spectrum into radiation in a first visible spectrum and the nanoparticles of the second type have the property of converting radiation in the near infrared (NIR) spectrum into radiation in a second visible spectrum, the first visible spectrum being different from the second visible spectrum.

Generally, the electret material is a material included within the group formed by polymethyl methacrylates (PMMA), cyclic olefin copolymers (COC), polyethylene terephthalates (PET), polydimethylsiloxanes (PDMS), polypropylenes (PP), polycarbonates (PC), polystyrenes (PS), polyvinyl chlorides (PVC), polytetrafluoroethylenes (PFTE), triglycine sulfate (TGS), polyvinylidene fluoride (PVDF), silicon nitride ($Si_3N_4$), silicon oxide ($SiO_2$), or the compound $Si_3N_4/SiO_2/Si$ (NOS).

Generally, the colloidal nanoparticles are compounds stabilized by themselves or by ligands and/or charges, having physical properties included within the group formed by plasmonic, conducting, magnetic, luminescent, catalytic, electrochromic or photochromic properties, rendered substantially neutral and electrically polarizable, produced from base colloidal nanoparticles.

The base colloidal nanoparticles have a solid core and, if appropriate, a shell and are included within the group formed by the latex, $SiO_2$, $TiO_2$, $ZrO_2$; CdS, CdSe, PbSe, GaAs, GaN, InP, $In_2O_3$, ZnS, ZnO, $MoS_2$, Si, C, ITO, $Fe_2O_3$, $Fe_3O_4$, Co, Fe—Co, $Fe_3C$, $Fe_5C_2$, Ni; Au, Ag, Cu, Pt, and the bimetallic nanoparticles; $WO_3$; $NaLnF_4$, the lanthanide fluorides ($LnF_3$), the lanthanide oxides ($Ln_2O_3$), the zirconates, silicates, hydroxides ($Ln(OH)_3$) and the sulfides of oxides doped or not doped with one or more different lanthanides (Ln denoting a lanthanide), the mixtures of these compounds. When the dispersing medium is a nonpolarizing liquid solvent, the solvent is included within the group formed by pentane, isopentane, hexane, heptane, octane, nonane, decane, cyclopentane, cyclohexane, cycloheptane, cyclooctane, cyclohexene, benzene, toluene, methylcyclohexane, xylene, mesitylene, chloroform, methylene chloride or tetrachloroethylene.

When the dispersing medium is a nonpolarizing dispersing gas, the dispersing gas is included within the group formed by molecular nitrogen $N_2$, argon Ar and air.

In particular, microstructures of colloidal nanoparticles are compact mono- and multilayer assemblies of $\beta$-$NaYF_4$ nanocrystals having optical up-conversion, packed as close as possible, which assemblies are attached to electret films made of PMMA and with a thickness of 100 nm. The number of layers of nanocrystals deposited is precisely regulated by the surface potential of the patterns of charges written in the electret films made of PMMA and the concentration of nanocrystals in the dispersion.

The formation of multilayer assemblies of nanocrystals requires patterns of charges having a high surface potential, high concentrations of high nanocrystals and an electrically nonpolarizing dispersing solvent. The nanocrystals have to be electrically polarizable to a high degree and neutral in electrostatic terms.

Binary assemblies of nanocrystals are created by using an electret substrate on which patterns of positive and negative charges have been written and by immersing the written substrate in dispersions of nanocrystals, for example $\beta$-$NaYF_4$, with different electric charges and with up-conversion luminescence of different spectra. The up-conversion luminescence properties of the assemblies of nanocrystals are well correlated with their geometry and their composition.

All these characteristics make possible the manufacture of micro/nanopatterns of nanocrystals encoded in terms of (i) geometry, (ii) type of nanocrystals, (iii) luminescence intensity and (iv) emission color by the use of two types of up-conversion nanocrystals.

Furthermore, the assemblies coded in terms of colors can be rendered nondiscernible in terms of topography, thus effectively hiding the information.

The speed and economic efficiency of the processes described above, the ability to write any patterns of desired geometric shape and the mastery of the control of the spatial architecture of the assembly in the three directions, for example denoted by the axes recorded as X, Y and Z, make it possible to construct unique micro/nanostructures of complex shapes, coded in terms of colors and of intensities, which can be used as anticounterfeiting and/or traceability and/or authentication labels having a high level of security.

The anticounterfeiting and/or traceability and/or authentication labels can exhibit various levels of security, it being possible or not for said levels of security to be cumulative. These levels of security can be:
- the micro/nanosize of the structures, which renders the structures "invisible" to the eye and impossible to find with a microscope if their exact location is not known;
- the luminescence, it being known that, in the presence of binary assemblies or of assemblies of more than two types of nanoparticles, the micro/nanostructure can exhibit at least two different emission wavelengths;
- the luminescence intensity, it being possible for the latter to exhibit variations for the same micro/nanostructure, these variations being due to different heights of assemblies within the same micro/nano structure;
- the random deposition of nanoparticles over a surface region of the electret substrate, outside the assembly, this deposition exhibiting a unique signature specific to each micro/nanostructure;
- the masking of an assembly of nanoparticles by one or more other assemblies of nanoparticles, the masking being obtained with binary assemblies or assemblies of more than two types of nanoparticles not discernible in terms of topography, thus effectively hiding the information. Said masking renders the identification of the information topographically impossible, only reading in luminescence making it possible to reveal the information.

The anticounterfeiting and/or traceability and/or authentication labels exhibiting one or more levels of security encode, in addition, information topographically, the micro/nanostructure exhibiting a specific geometry.

According to FIG. 19, an anticounterfeiting and/or traceability and/or authentication label is, for example, a three-dimensional QR code detectable in fluorescence by optical microscopy. The colloidal nanoparticles are in this instance latex particles with a diameter of 100 nm.

In an alternative form, the second embodiment of the process 602 described in FIG. 18 can be generalized by the use of a sequence according to a predetermined order of an integral number, greater than or equal to two, of pairs of stages, each pair of stages being associated with an order or a rank k of location in the sequence, with a predetermined type of substantially neutral and polarizable nanoparticles to be deposited dependent on the rank k and with a predetermined deposition geometry dependent on the rank k.

Each pair of stages, characterized by its rank k, is the sequence of a first stage of writing with rank k of a pattern of charges dependent on the predetermined type of particles to be deposited and on the associated deposition geometry function of the rank k and of a second stage of deposition of the nanoparticles having the type associated with the rank k on the pattern of charges written during the first stage associated with the rank k.

Thus, ternary three-dimensional assemblies of nanoparticles having high compactness and assemblies having an even higher number of types of different nanoparticles can be obtained in particular.

In an alternative form, an anticounterfeiting and/or traceability and/or authentication label comprising a micro/nanostructure of colloidal nanoparticles as defined above or obtained by the process defined above additionally comprises:
- a structure of nanoparticles which are attached in chance and uncontrolled manner according to a deposition noise, having a distribution which is not very dense in terms of compactness and random, produced on a surface region of the electret substrate which is not covered by the assembly and located on the electret substrate by spatial coordinates, and
- an image of said random structure of nanoparticles which are deposited on the located surface region, the captured image being according to preference an AFM topographical image, an optical image or a photoluminescence image and being stored in a memory.

The coordinates of the image of said random structure are saved on an information medium corresponding to the image of said random structure. The information medium is, for example, the same recording medium as that of the image. It can also be a different recording medium. In all cases, an allocation information link, for example a computer link, exists between the image of the random structure and its spatial coordinates.

The invention claimed is:

1. A process for the manufacture of a micro/nanostructure formed of colloidal nanoparticles comprising a monolayer or multilayer assembly of colloidal nanoparticles which are attached to an electret substrate, having a freely chosen and predetermined geometric shape, at least the first layer of which is compact in terms of absence of undesired gaps with sizes of greater than or equal to the size of two adjacent nanoparticles, optionally greater than or equal to the size of one nanoparticle, comprising the stages consisting of:
   in a first stage, providing the electret substrate, composed of an electret material and having a free receiving surface, then
   in a second stage, writing a surface electric potential on the receiving surface of the electret substrate according to a predetermined pattern of positive and/or negative electric charges corresponding to the monolayer or multilayer assembly of nanoparticles, then
   in a third stage, bringing the electret substrate having the receiving surface written with the surface potential according to the desired pattern of electric charges into contact with a colloidal dispersion for a contacting time which is less than or equal to fifteen minutes,
wherein:
   the colloidal dispersion comprises electrically neutral or quasineutral colloidal particles which are electrically polarizable under the action of an external electric field and a dispersing medium, in the form of a liquid solvent or a gas which is substantially devoid of an electrical polarization action, in which the colloidal nanoparticles are dispersed, and
   the absolute value of the surface electric potential and the concentration of polarizable nanoparticles are respectively greater than or equal to a first surface electric potential threshold and to a second concentration threshold, the first and second thresholds each depending on the nature of the dispersing medium and on the nature of the polarizable nanoparticles, so that
   after the first contacting time, the micro/nanostructure obtained is a monolayer or multilayer micro/nanostructure having the desired geometric shape, at least the first layer of which is compact in terms of absence of undesired gaps with sizes greater than or equal to the size of two adjacent nanoparticles, optionally greater than or equal to the size of one nanoparticle, the nanoparticles being bonded to one another and/or to the substrate under the action of dielectrophoretic forces created from the interaction between the polarizable nanoparticles and the written surface potential.

2. The process as claimed in claim 1, in which:

the assembly of colloidal nanoparticles which are attached to the electret substrate, having a freely chosen and predetermined geometric shape, is a multilayer assembly, at least the first layer of which is compact, and the absolute value of the surface electric potential and the concentration of polarizable nanoparticles are respectively greater than or equal to a third surface electric potential threshold and greater than or equal to a fourth concentration threshold, the third and fourth thresholds each depending on the nature of the dispersing medium and on the nature of the polarizable nanoparticles, so that after the contacting time, the micro/nanostructure obtained is the multilayer micro/nanostructure having the desired geometric shape, at least the first layer of which is compact in terms of absence of undesired gaps with sizes of greater than or equal to the size of two adjacent nanoparticles, optionally with sizes greater than or equal to the size of one nanoparticle, the nanoparticles being bonded to one another and/or to the substrate under the action of dielectrophoretic forces created from the interaction between the neutral and electrically polarizable nanoparticles and the written surface potential.

3. The process as claimed in claim 1, in which:

the assembly of colloidal nanoparticles which are attached to an electret substrate, having a freely chosen and predetermined geometric shape, is a multilayer assembly of a certain number NI of layers, each of the layers of which is compact in terms of absence of undesired gaps with sizes greater than the size of two adjacent nanoparticles, optionally greater than the size of one nanoparticle, and the absolute value of the surface electric potential and the concentration of polarizable nanoparticles are respectively greater than or equal to a fifth surface electric potential threshold and to a sixth concentration threshold, the fifth and sixth thresholds each depending on the nature of the dispersing medium, on the nature of the polarizable nanoparticles and on the number of layers, so that after the contacting time, the micro/nanostructure obtained is the multilayer micro/nanostructure having the desired geometric shape, all the layers of which are compact in terms of absence of undesired gaps with a size greater than or equal to the size of two adjacent nanoparticles, optionally greater than or equal to the size of one nanoparticle, the nanoparticles being bonded to one another and/or to the substrate under the action of dielectrophoretic forces created from the interaction between the polarizable nanoparticles and the written surface potential.

4. The process as claimed in claim 1, in which the stage of writing the surface electric potential on the receiving surface of the electret substrate according to a pattern of charges is carried out according to preference, by a process of sequential writing of positive and/or negative charges on the electret substrate included within the group formed by inscription of electric charges by a beam of focused ions, inscription of electric charges by a beam of focused electrons, inscription of electric charges by atomic force microscopy (AFM) and inscription of electric charges by electrophotography, by a process of writing in parallel of positive and/or negative charges on the electret substrate included within the group formed by electrical nanoimprinting and electrical microcontact.

5. The process as claimed in claim 1, in which:

the electret material is a material included within the group formed by polymethyl methacrylates (PMMA), cyclic olefin copolymers (COC), polyethylene terephthalates (PET), polydimethylsiloxanes (PDMS), polypropylenes (PP), polycarbonates (PC), polystyrenes (PS), polyvinyl chlorides (PVC), polytetrafluoroethylenes (PFTE), triglycine sulfate (TGS), polyvinylidene fluoride (PVDF), silicon nitride ($Si_3N_4$), silicon oxide ($SiO_2$), or the compound $Si_3N_4/SiO_2/Si$ (NOS);

the substantially neutral and electrically polarizable colloidal nanoparticles are compounds stabilized by themselves or by ligands and/or charges, having physical properties included within the group formed by plasmonic, conducting, magnetic, luminescent, catalytic, electrochromic or photochromic properties, rendered substantially neutral and electrically polarizable, produced from base colloidal nanoparticles, the base colloidal nanoparticles having a solid core and, if appropriate, a shell and being included within the group formed by the latex, $SiO_2$, $TiO_2$, $ZrO_2$; CdS, CdSe, PbSe, GaAs, GaN, InP, $In_2O_3$, ZnS, ZnO, $MoS_2$, Si, C, ITO, $Fe_2O_3$, $Fe_3O_4$, Co, Fe—Co, $Fe_3C$, $Fe_5C_2$, Ni; Au, Ag, Cu, Pt, and the bimetallic nanoparticles; $WO_3$; $NaLnF_4$, lanthanide fluorides ($LnF_3$), lanthanide oxides ($Ln_2O_3$), zirconates, silicates, hydroxides (Ln $(OH)_3$) and sulfides of oxides doped or not doped with one or more different lanthanides (Ln denoting a lanthanide), mixtures of these compounds, and dispersing medium for the polarizable nanoparticles is selected from the group consisting of a liquid solvent or a nonpolarizing gas, the liquid solvent being included within the group formed by pentane, isopentane, hexane, heptane, octane, nonane, decane, cyclopentane, cyclohexane, cycloheptane, cyclooctane, cyclohexene, benzene, toluene, methylcyclohexane, xylene, mesitylene, chloroform, methylene chloride or tetrachloroethylene, the nonpolarizing dispersing gas being included within the group formed by molecular nitrogen $N_2$, argon Ar and air.

6. The process as claimed in claim 1, comprising the additional stages consisting in:

choosing and locating by spatial coordinates on the electret substrate where the assembly has been formed a surface region not covered by the assembly to which nanoparticles have been attached in a chance and uncontrolled manner, in the form of a structure resulting from deposition noise, having a distribution which is not very dense in terms of compactness, random and dependent on the sample of the electret substrate on which the assembly has been formed, then capturing an image of the random structure of the nanoparticles deposited in the chosen surface region and forming a signature, the captured image being according to preference an AFM topographical image, an optical image or a photoluminescence image, then saving in a memory the captured image and the spatial coordinates of the corresponding surface region.

7. An anticounterfeiting and/or traceability and/or authentication label obtained by the process as claimed in claim 1.

8. A process of manufacturing a binary micro/nanostructure formed of two types of colloidal nanoparticles, comprising:
- a first monolayer assembly of colloidal nanoparticles of the first type, which are attached to an electret substrate, having a first freely chosen and predetermined geometric shape, and
- a second monolayer or multilayer assembly of colloidal nanoparticles of the second type, which are attached to the electret substrate, having a second freely chosen and predetermined geometric shape, at least the first layer of which is compact in terms of absence of undesired gaps with a size greater than or equal to the size of two adjacent nanoparticles of the second type, preferably optionally greater than or equal to the size of one nanoparticle, wherein the process comprises the stages consisting in:
- in a first stage, providing the electret substrate composed of an electret material and having a free receiving surface, then
- in a second stage, writing, sequentially or in parallel, a surface electric potential on the receiving surface of the electret substrate according to a predetermined pattern of electric charges having a first sign and of electric charges having a second sign opposite the first, the pattern of charges being composed of a first subpattern of charges of the first sign, corresponding to the first monolayer assembly of nanoparticles of the first type, and of a second subpattern of charges of the second sign, corresponding to the second monolayer or multilayer assembly of nanoparticles of the second type,
- in a third stage, bringing the electret substrate having the receiving surface written with the surface potential into contact with a first colloidal dispersion for a first contacting time, the first colloidal dispersion comprising nanoparticles of the first type electrically charged according to the second sign and a first dispersing medium in the form of a liquid solvent or of a gas and the first contacting time being sufficiently long to allow the formation, on the first subpattern of charges written in the electret substrate, of the first monolayer assembly, having the desired first geometric shape, of nanoparticles of the first type bonded to the substrate under the action of electrophoretic forces created from the Coulomb interaction between the nanoparticles of the first type and the surface potential of the first subpattern of charges, then
- in a fourth stage, drying the electret substrate and the first assembly, together forming an intermediate micro/nanostructure of end of third stage, by removing the first dispersing medium, then
- in a fifth stage, bringing the dried intermediate structure into contact with a second colloidal dispersion for a second contacting time, the second colloidal dispersion comprising colloidal nanoparticles of the second type which are electrically neutral or quasineutral and electrically polarizable under the action of an external electric field and a second dispersing medium in the form of a liquid solvent or of a gas, substantially devoid of an electrical polarization action, in which the colloidal nanoparticles of the second type are dispersed, and
- the absolute value of the surface electric potential and the concentration of nanoparticles of the second type being respectively greater than or equal to a first surface electric potential threshold and greater than or equal to a second concentration threshold, the first and second thresholds each depending on the nature of the second dispersing medium and on the nature of the polarizable nanoparticles of the second type, such that
- after the second contacting time, which is less than 15 minutes, the second assembly obtained is the second monolayer or multilayer assembly having the second desired geometric shape, and at least the first layer of which is compact in terms of absence of undesired gaps with a size greater than or equal to the size of two adjacent nanoparticles, optionally greater than or equal to the size of one nanoparticle, the nanoparticles being bonded to one another and/or to the substrate under the action of dielectrophoretic forces created from the interaction between the polarizable nanoparticles and the surface potential of the second subpattern.

9. The process as claimed in claim 8, wherein the colloidal nanoparticles of the first type have the property of converting radiation in the near infrared (NIR) spectrum into radiation in a first visible spectrum, and the nanoparticles of the second type have the property of converting the same radiation in the near infrared (NIR) spectrum into radiation in a second visible spectrum, the first visible spectrum being different from the second visible spectrum.

10. The process as claimed in claim 8, wherein the concentration of charged nanoparticles of the first type, the first dispersing medium, the nanoparticles of the first type in terms of size, the first subpattern of charges, the first contacting time, the concentration of polarizable nanoparticles of the second type, the second dispersing medium, the nanoparticles of the second type in terms of size and polarizability and the second contacting time are chosen in order to obtain the first assembly having the first geometric shape and the second assembly having the desired second geometric shape, the first and second geometric shapes being conjugate shapes having the same height with respect to the receiving surface of the substrate, so that the geometric shape of the first assembly and the geometric shape of the second separate assembly are undetectable topographically by Atomic Force Microscopy (AFM) or by optical microscopy using illumination in the visible spectrum.

11. A process of manufacturing a binary micro/nanostructure formed of two types of colloidal nanoparticles comprising:
- a first monolayer or multilayer assembly of colloidal nanoparticles of the first type, which are attached to an electret substrate, having a first freely chosen and predetermined geometric shape, and
- a second monolayer or multilayer assembly of colloidal nanoparticles of the second type, which are attached to the electret substrate, having a second freely chosen and predetermined geometric shape, at least the first layer of which is compact in terms of absence of undesired gaps with a size greater than the size of two adjacent nanoparticles of the second type, optionally greater than the size of one nanoparticle of the second type, wherein the process comprises the stages consisting in:
- in a first stage, providing the electret substrate composed of an electret material and having a free receiving surface, then
- in a second stage, writing, sequentially or in parallel, a first surface electric potential on the receiving surface of the electret substrate according to a first predetermined subpattern of electric charges having a first sign, corresponding to the first assembly of nanoparticles of the first type, the first subpattern making up a first part of a pattern of charges which also comprises a second predetermined subpattern of electric charges having a second sign opposite the first sign, in a third stage, bringing the electret substrate having the receiving surface written with the first surface potential into contact with a first colloidal dispersion for a first contacting time of less than or equal to 15 minutes, the first colloidal dispersion comprising nanoparticles of the first type, either electrically charged according to the second sign or substantially neutral and electrically polarizable, and a first dispersing medium in the form of a liquid solvent or of a gas and the first contacting time being sufficiently long to allow the formation, on the first subpattern of charges written in the electret substrate, of the first assembly, having the first monolayer or multilayer geometric shape, of nanoparticles of the first type bonded to the substrate, either under the action of electrophoretic forces created from the Coulomb interaction between the nanoparticles of the first type and the surface potential of the first subpattern of charges, when the nanoparticles of the first type are electrically charged according to the second sign, or under the action of dielectrophoretic forces created from the interaction between the polarizable nanoparticles and the surface potential of the first subpattern of charges when the nanoparticles of the first type are substantially neutral and electrically polarizable, in a fourth stage, drying the electret substrate and the first assembly, together forming an intermediate micro/nanostructure of end of third stage, then, in a fifth stage, writing, sequentially or in parallel, a second surface electric potential on the receiving surface of the electret substrate of the dried intermediate structure outside the regions covered by the first assembly, according to the second predetermined subpattern of electric charges having the second sign, then in a sixth stage, bringing the intermediate structure written with the second surface potential into contact with a second colloidal dispersion for a second contacting time, the second colloidal dispersion comprising colloidal nanoparticles of the second type, which are electrically neutral or quasineutral and electrically polarizable under the action of an external electric field, and a second dispersing medium in the form of a liquid solvent or of a gas, which is substantially devoid of an electrical polarization action, in which the colloidal nanoparticles are dispersed, and the value of the electric surface potential and the concentration of nanoparticles of the second type being respectively greater than or equal to a first surface electric potential threshold and greater than or equal to a second concentration threshold, the first and second thresholds each depending on the nature of the second dispersing medium and on the nature of the polarizable nanoparticles of the second type, so that, after the second contacting time, the second assembly obtained is the second monolayer or multilayer assembly having the second desired geometric shape, at least the first layer of which is compact in terms of absence of undesired gaps with a size greater than or equal to the size of two adjacent nanoparticles of the second type, optionally greater than or equal to the size of one nanoparticle of the second type, the nanoparticles being bonded to one another and/or to the substrate under the action of dielectrophoretic forces created from the interaction between the polarizable nanoparticles and the surface potential of the second subpattern.

12. A micro/nanostructure formed of colloidal nanoparticles comprising:

an electret substrate composed of an electret material and having a free receiving surface, in which a surface electric potential is written on the receiving surface of the electret substrate according to a pattern of positive and/or negative electric charges, an assembly of colloidal nanoparticles which are attached to the electret substrate, having a geometric shape, wherein:

the colloidal nanoparticles are electrically neutral or quasineutral and electrically polarizable under the action of an external electric field, and the polarizable nanoparticles are positioned as a monolayer or multilayers, being directly bonded to one another and/or to the substrate under the action of dielectrophoretic forces created by the interaction existing between the polarizable nanoparticles and the surface potential of the pattern of charges, and the pattern of electric charges of the same polarity written in the electret substrate corresponds to the geometric shape of the monolayer or multilayer assembly of nanoparticles, and the absolute value of the surface electric potential created by the pattern of charges is greater than or equal to a first surface electric potential threshold which depends on the nature of the polarizable nanoparticles and such that at least the first layer of the assembly of colloidal nanoparticles is compact in terms of absence of undesired gaps with a size greater than the size of two adjacent nanoparticles, optionally greater than the size of one nanoparticle.

13. The micro/nanostructure formed of colloidal nanoparticles as claimed in claim 12, in which:

the absolute value of the surface electric potential created by the pattern of charges is greater than or equal to a third threshold which depends on the nature of the polarizable nanoparticles, and such that the assembly is a multilayer assembly.

14. An anticounterfeiting and/or traceability and/or authentication label comprising a micro/nanostructure of colloidal nanoparticles defined as claimed in claim 12.

15. The anticounterfeiting and/or traceability and/or authentication label as claimed in claim 14, additionally comprising:

a structure of nanoparticles which are attached in chance and uncontrolled manner according to a deposition noise, having a distribution which is not very dense in terms of compactness and random, produced on a surface region of the electret substrate which is not covered by the assembly and located on the electret substrate by spatial coordinates, and an image of said random structure of nanoparticles which are deposited on the located surface region, the captured image being according to preference an AFM topographical image, an optical image or a photoluminescence image and being stored in a memory.

16. The anticounterfeiting and/or traceability and/or authentication label as claimed in claim 15, in which the coordinates of the image of said random structure are saved on an information medium corresponding to the image of said random structure.

17. A micro/nanostructure formed of colloidal nanoparticles of two different types comprising, in the form of a binary assembly, an electret substrate composed of an electret material and having a free receiving surface, a first monolayer or multilayer assembly of colloidal nanoparticles of the first type, which are attached to the electret substrate, a second monolayer or multilayer assembly of colloidal nanoparticles of the second type, which are attached to the electret substrate, wherein:

the electret substrate comprises a surface electric potential written on the receiving surface of the electret substrate according to a predetermined pattern of electric charges having a first sign and having a second sign opposite the first sign, the pattern of charges being composed of a first subpattern of charges of the first sign and of a second subpattern of charges of the second sign, and the nanoparticles of the first type forming the first monolayer or multilayer assembly are either electrically charged according to the second sign and bonded to the electret substrate under the action of Coulomb forces created by the interaction existing between the nanoparticles of the first type and the surface potential of the first subpattern of charges written in the electret substrate or substantially neutral and electrically polarizable and bonded to one another and/or to the substrate under the action of dielectrophoretic forces created from the interaction existing between the nanoparticles of the second type and the surface potential of the first subpattern of charges written in the electret substrate, and the colloidal nanoparticles of the second type forming the second monolayer or multilayer assembly are electrically neutral or quasineutral and electrically polarizable under the action of an external electric field and bonded to one another and/or to the substrate under the action of dielectrophoretic forces created from the interaction existing between the nanoparticles of the second type and the surface potential of the second subpattern of charges written in the electret substrate, and the second subpattern of electric charges of the second sign written in the electret substrate corresponds to the geometric shape of the second monolayer or multilayer assembly of nanoparticles, and the absolute value of the surface electric potential created by the pattern of charges is greater than a first surface electric potential threshold which depends on the nature of the polarizable nanoparticles, and such that at least the first layer of the second assembly of colloidal nanoparticles is compact in terms of absence of undesired gaps with sizes greater than or equal to the size of two adjacent nanoparticles, optionally greater than or equal to the size of one nanoparticle.

18. The micro/nanostructure formed of colloidal nanoparticles of two different types as claimed in claim 17, in which:

the nanoparticles of the first type and the nanoparticles of the second type respectively have a first size and a second size, and the first and second assemblies respectively have a first number and a second number of layers, and the product of the first number of layers by the first size and the product of the second number of layers by the second size are substantially equal, and the shapes of the first and second subpatterns of voltage in terms of intensity coding, of sign of the potential on the receiving surface of the electret substrate are configured so that the first and second geometric shapes respectively of the first assembly and of the second assembly are conjugate shapes and have substantially the same height with respect to the receiving surface of the substrate, thus rendering the geometric shape of the first assembly and the geometric shape of the second assembly undetectable separately topographically by AFM and/or by optical microscopy using illumination in the visible spectrum.

19. The micro/nanostructure of colloidal nanoparticles of two different types as claimed in claim 17, in which:

the nanoparticles of the first type have the property of converting radiation in the near infrared (NIR) spectrum into radiation in a first visible spectrum and the nanoparticles of the second type have the property of converting the same radiation in the near infrared (NIR) spectrum into radiation in a second visible spectrum, the first visible spectrum being different from the second visible spectrum.

* * * * *